United States Patent
Lin et al.

(10) Patent No.: US 12,382,629 B2
(45) Date of Patent: Aug. 5, 2025

(54) SEMICONDUCTOR MEMORY DEVICES AND METHODS OF MANUFACTURING THEREOF

(71) Applicant: Taiwan Semiconductor Manufacturing Company, Ltd., Hsinchu (TW)

(72) Inventors: Meng-Han Lin, Hsinchu (TW); Chia-En Huang, Xinfeng (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 425 days.

(21) Appl. No.: 17/408,098

(22) Filed: Aug. 20, 2021

(65) Prior Publication Data
US 2023/0053623 A1    Feb. 23, 2023

(51) Int. Cl.
| | |
|---|---|
| H10B 41/27 | (2023.01) |
| H01L 25/065 | (2023.01) |
| H10B 41/10 | (2023.01) |
| H10B 43/10 | (2023.01) |
| H10B 43/27 | (2023.01) |

(52) U.S. Cl.
CPC ......... H10B 41/27 (2023.02); H01L 25/0655 (2013.01); H10B 41/10 (2023.02); H10B 43/10 (2023.02); H10B 43/27 (2023.02)

(58) Field of Classification Search
CPC ........ H10B 41/27; H10B 41/10; H10B 43/10; H10B 43/27; H10B 41/20; H10B 43/20; H01L 25/0655
See application file for complete search history.

(56) References Cited

U.S. PATENT DOCUMENTS

| | | | |
|---|---|---|---|
| 9,209,031 B2 * | 12/2015 | Baenninger | H01L 21/31111 |
| 2012/0326223 A1 * | 12/2012 | Omura | H01L 23/528 |
| | | | 257/E21.21 |
| 2017/0162594 A1 * | 6/2017 | Ahn | H10B 41/27 |
| 2020/0381450 A1 * | 12/2020 | Lue | H10B 43/27 |

* cited by examiner

*Primary Examiner* — Britt D Hanley
*Assistant Examiner* — William C. Trice, III
(74) *Attorney, Agent, or Firm* — FOLEY & LARDNER LLP

(57) ABSTRACT

A semiconductor device comprising a source, and a drain spaced apart from the source in a first direction. A channel layer is disposed radially outwards of at least one radially outer surface of the source and the drain in a second direction perpendicular to the first direction, the channel layer extending in the first direction. A memory layer is disposed on a radially outer surface of the channel layer in the second direction and extending in the first direction. A contact structure is interposed between the channel layer and at least a portion of the source and/or the drain, the contact structure having a lower resistance than the channel layer.

20 Claims, 23 Drawing Sheets

SEMICONDUCTOR MEMORY DEVICES AND METHODS OF MANUFACTURING THEREOF

BACKGROUND

The present disclosure generally relates to semiconductor devices, and particularly to 3-dimensional (3D) memory devices and methods of making such semiconductor devices.

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
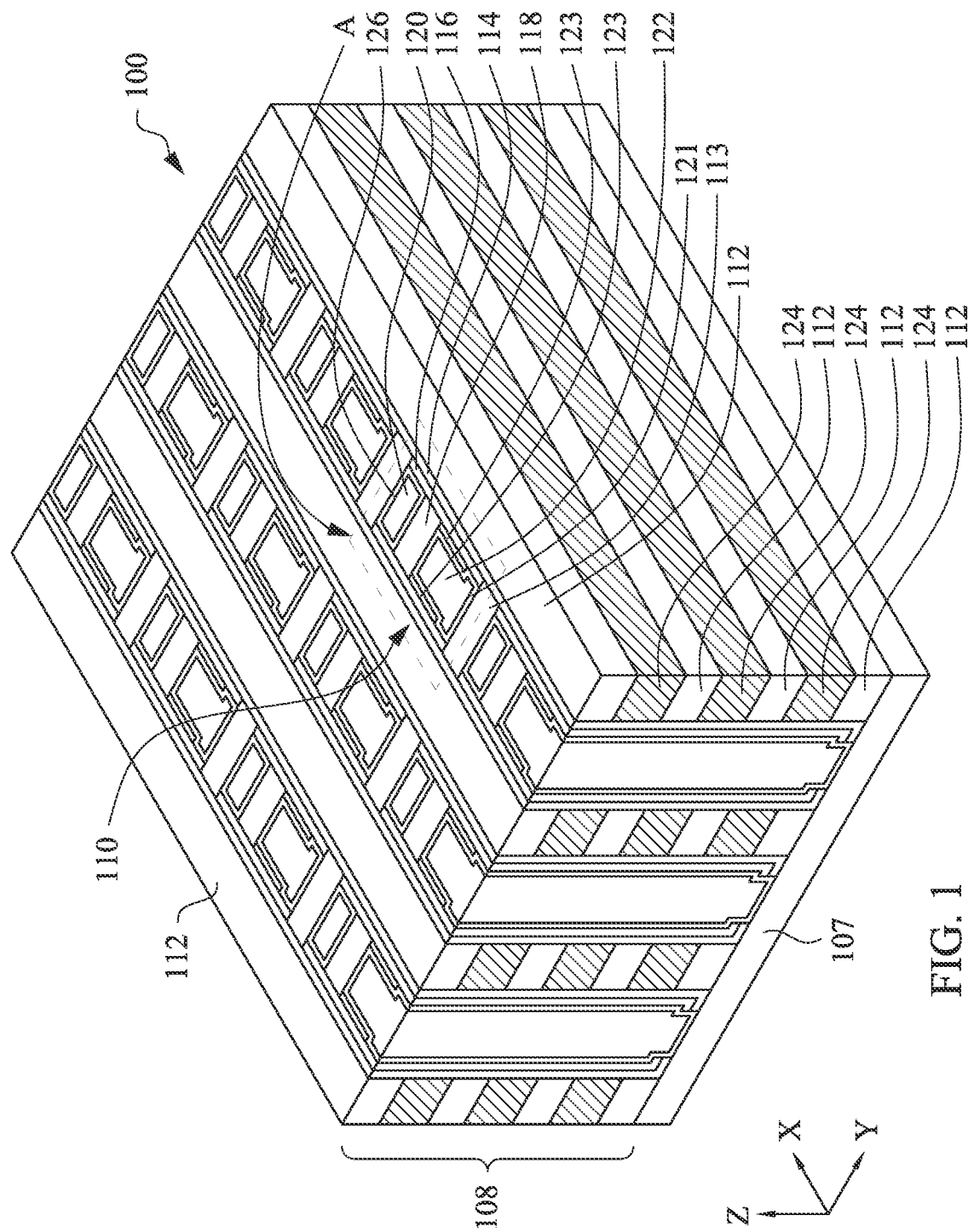
FIG. 1 is a top, perspective view of a semiconductor die including an array of semiconductor devices, each semiconductor device including a source, pair of drains spaced apart from the source, and gate extension structures coupled to a corresponding drain and channel layer of the semiconductor device, according to an embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, 3D memories include an array of memory devices formed in a stack of insulating layers and gate layers, and may include a double gate or plurality of gate layers. Such double gate extension structures can provide a higher etching aspect ratio. During fabrication, the die including an array of semiconductor devices, for example, memory devices is formed that may include a source and a drain. A spacer formed from an insulating material may be disposed between the source and the drain. Generally a channel layer extends across radially outer surfaces of the source and drain, and a memory layer is coupled to a radially outer surface of the channel layer, the memory layer coupled to a corresponding gate layer/s. In some instances, a gate extension structure may also be disposed between at least a portion of the drain and the channel layer, and allows a higher electric field across the channel layer, and facilitates polarization switching in the channel layer, further resolving read fail issues.

In such memory devices, ohmic contact between the channel layer and the source, and the channel layer and the drain, is important to determine performance of the memory device. The material forming the channel layer can be highly doped to reduce its resistance and form an ohmic contact with the source and the drain material. However, high doping of the channel material can cause negative transition voltage of the memory device, which is undesirable.

Embodiments of the present disclosure are discussed in the context of forming a semiconductor die, and particularly in the context of forming 3D memory device, that are formed in a stack of insulating layers and gate layers. The 3D memory devices include a contact structure interposed between the source and/or drain. The contact structure has a lower resistance (e.g., has significant higher doping than the channel material) relative to the channel layer. Thus, the channel layer can have lower doping to beneficially maintain the transition voltage in the positive regime, while forming an ohmic contact between the source/drain and the channel layer via the low resistance (e.g., highly doped) contact structure.

FIG. 1 is a top, perspective view of a semiconductor die 100 that includes an array of semiconductor devices 110 (e.g., memory devices), according to an embodiment. The semiconductor die 100 includes a substrate 107 (e.g., a silicon, or silicon on insulator (SOI) substrate, germanium, silicon oxide, silicon carbide, silicon-germanium, silicon nitride, or any other suitable substrate) on which the plurality of semiconductor devices 110 are disposed. The array of semiconductor devices 110 are arranged in a plurality of rows, each of which extend in a first direction (e.g., the X direction). Each semiconductor device 110 is separated and electrically isolated from an adjacent semiconductor device 110 within a row by a device spacer 113, which may be formed from an electrically insulating material (e.g., silicon oxide ($SiO_2$), silicon nitride (SiN), silicon oxide (SiO), silicon carbide nitride (SiCN), silicon oxycarbonitride (SiOCN), silicon oxynitride (SiON), HfO2, $TaO_x$, $TiO_x$, $AlO_x$, etc.).

Figure 2:
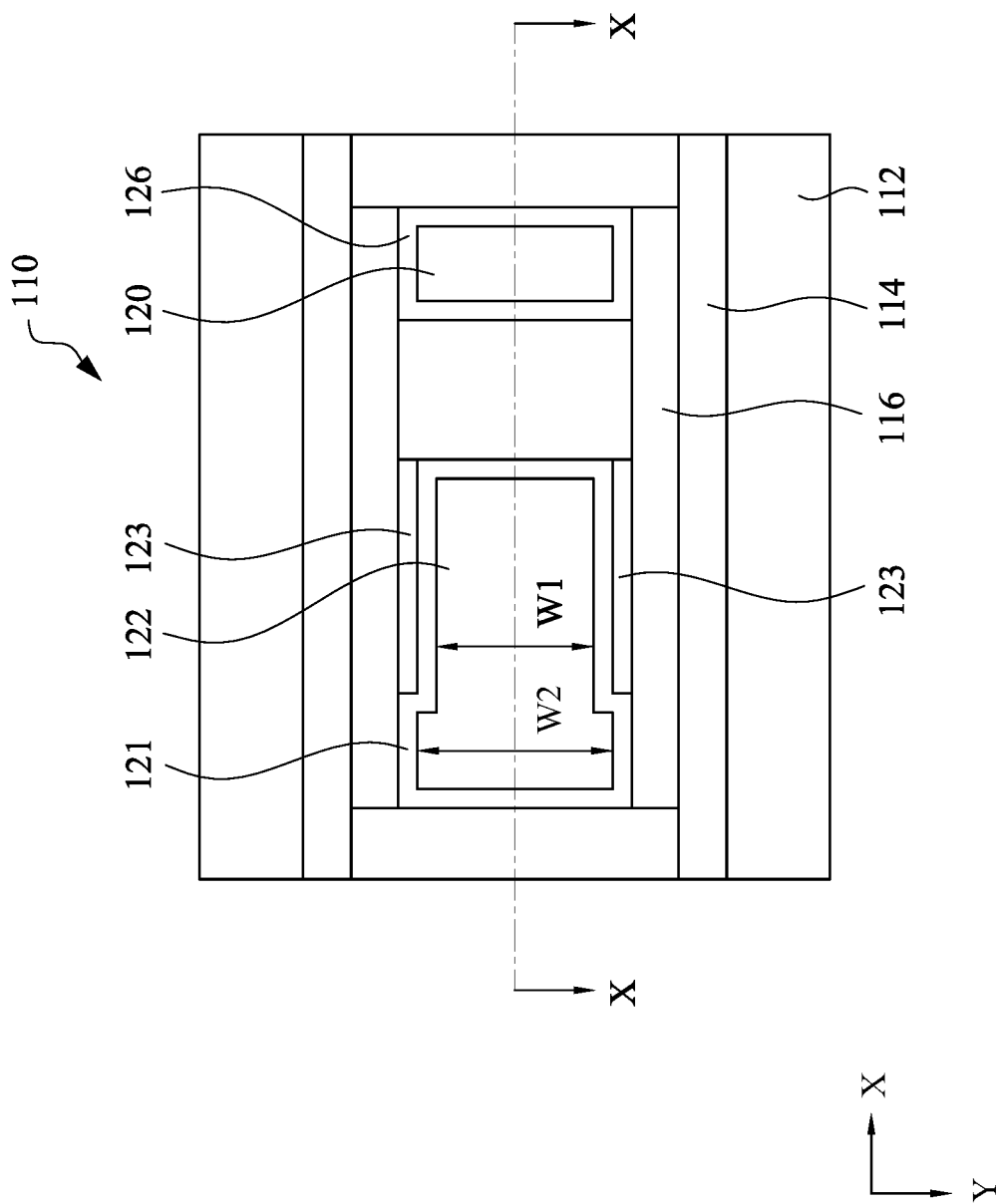
FIG. 2 is a top view of a portion of the semiconductor die of FIG. 1 indicated by the arrow A in FIG. 1.
Figure 3:
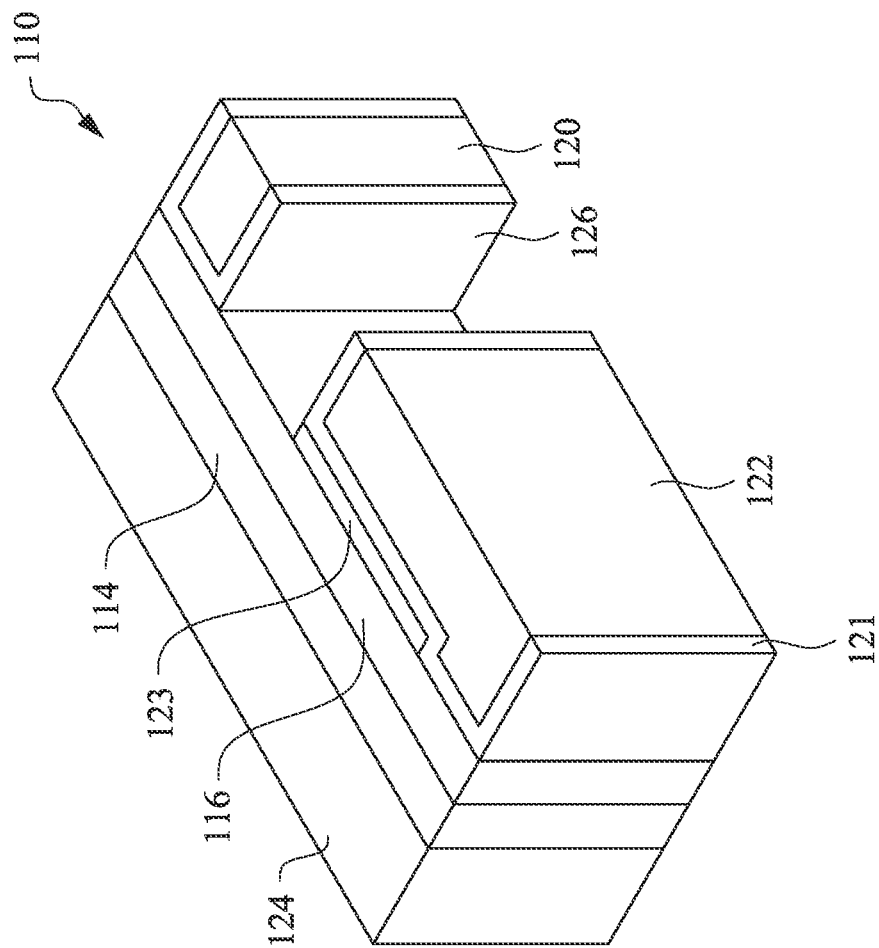
FIG. 3 is a top, perspective cross-sectional view of the semiconductor device of FIG. 2 taken along the line X-X in FIG. 2, with an inner spacer disposed between a source and drain of the semiconductor device removed for clarity.
Figure 4:
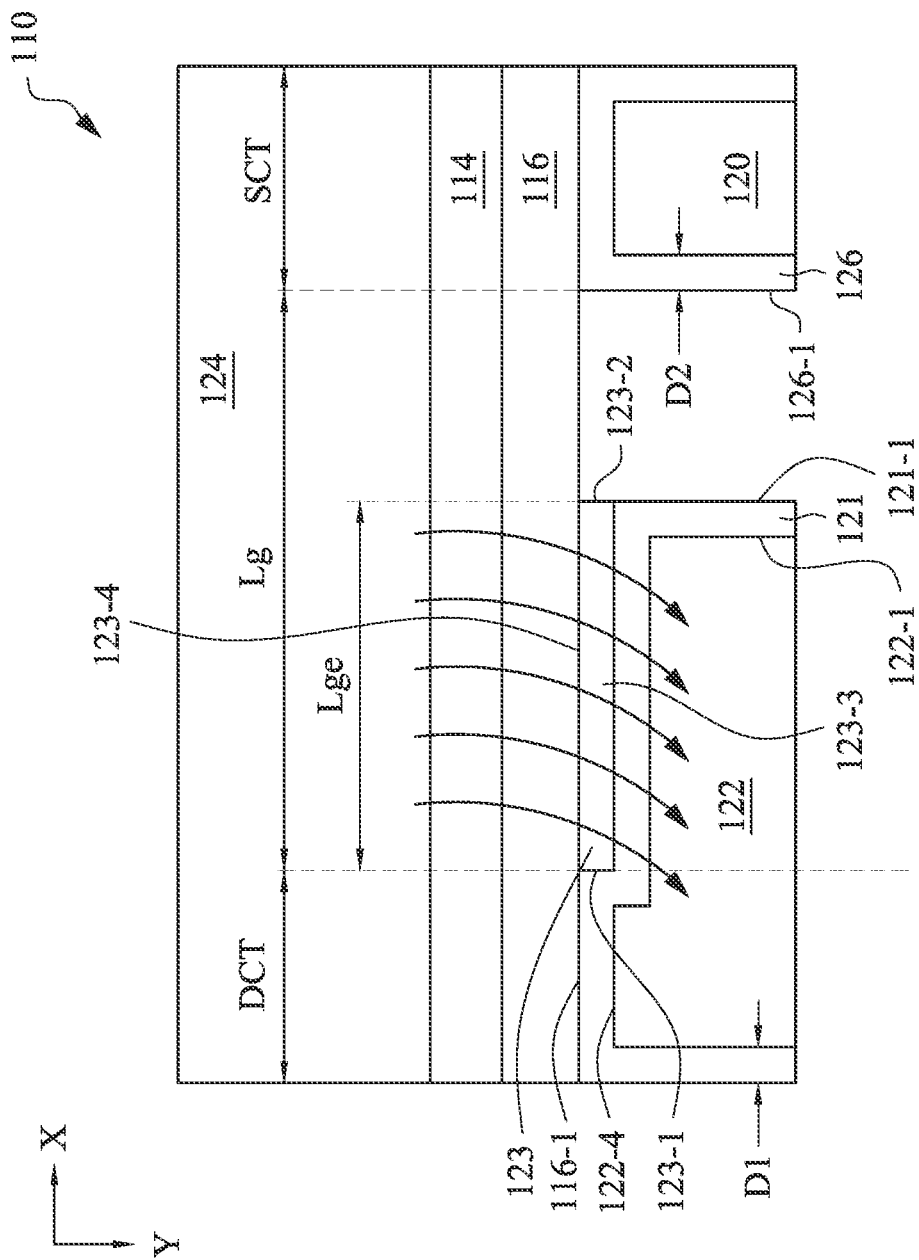
FIG. 4 is a top, cross-sectional view of the semiconductor device of FIG. 3, with an inner spacer disposed between a source and drain of the semiconductor device removed for clarity.

FIG. 2 is a top view of a portion of the semiconductor die of FIG. 1 indicated by the arrow A in FIG. 1. FIG. 3 is a top, perspective cross-sectional view of the semiconductor device of FIG. 2 taken along the line X-X in FIG. 2, with an inner spacer disposed between a source and drain of the semiconductor device removed for clarity. FIG. 4 is a top, cross-sectional view of the semiconductor device of FIG. 3, with an inner spacer disposed between a source and drain of the semiconductor device removed for clarity. As shown in FIGS. 2-4, each semiconductor device 110 includes a source 120 and a drain 122 spaced apart from the source in the first direction (e.g., the X-direction). An inner spacer 118 may be disposed between the source 120 and the drain 122. In some embodiments, the source 120 and the drain 122 may include a conducting material, for example, metals such as Al, Ti, TIN, TaN, Co, Ag, Au, Cu, Ni, Cr, Hf, Ru, W, Pt, WN, Ru, any other suitable material or a combination or alloy thereof. In some embodiments, the source 120 and/or the drain 122 may include a semiconductor material, for example, an n or p-doped semiconductor such as Si, SiGe, or any other semiconductor material (e.g., IGZO, ITO, IWO, poly silicon, amorphous Si, etc.), and may be formed using a deposition process, an epitaxial growth process, or any other suitable process. The source 120 and the drain 122 extend from a top surface of the semiconductor die 100 to the substrate 107 in a vertical direction (e.g., the Z-direction).

The inner spacer 118 extends between the source 120 and the drain 122. The inner spacer 118 may be formed from an electrically insulating material, for example, silicon nitride (SiN), silicon oxide (SiO), $SiO_2$, silicon carbide nitride (SiCN), silicon oxycarbonitride (SiOCN), silicon oxynitride (SiON), HfO2, $TaO_x$, $TiO_x$, $AlO_x$, etc. The inner spacer 118 extends from a top surface of the semiconductor die 100 to the substrate 107 in a vertical direction (e.g., the Z-direction).

A channel layer 116 is disposed outwards of a radially outer surface of the source 120 and the drain 122 in a second direction (e.g., the Y-direction) perpendicular to the first direction (e.g., the X-direction) and is in electrical contact with the source 120 and the drain 122 through contact structures 121 and 126, as described in further detail herein. The channel layer 116 extends from a top surface of the semiconductor die 100 to the substrate 107 in a vertical direction (e.g., the Z-direction). The channel layer 116 extends in the first direction (e.g., the X-direction) from an axially outward edge of the source 120 to an opposite axially outward edge of the drain 122. In some embodiments, the channel layer 116 may be formed from a semiconductor material, for example, Si (e.g., polysilicon or amorphous silicon), Ge, SiGe, silicon carbide (SiC), IGZO, ITO, ZnO, IWO, etc. and can be an n-type or p-type doped semiconductor. In the particular embodiment shown in FIGS. 1-4, each semiconductor device 110 includes a pair of channel layers 116. As shown best in FIG. 2, one of the pair of channel layers 116 is disposed radially outwards of first radially outer surfaces of the source 120 and the drain 122 in the second direction (e.g., the Y-direction), and the other of the pair of channel layers 116 is disposed radially outwards of second radially outer surfaces of the source 120 and the drain 122 opposite the first radially outer surfaces. In other embodiments, each semiconductor device 110 may include a single channel layer 116 disposed radially outwards of the first or the second radially outer surfaces of the source 120 and the drain 122. In some embodiments, the channel layer 116 may include a doped material (e.g., a doped semiconductor), doped with a first concentration of a dopant (e.g., an n-type or p-type dopant).

A memory layer 114 is disposed on a radially outer surface of the channel layer 116 in the second direction (e.g., the Y-direction) and extends in the first direction (e.g., the X-direction). The memory layer 114 extends from a top surface of the semiconductor die 100 to the substrate 107 in a vertical direction (e.g., the Z-direction). In some embodiments, the memory layer 114 may include a ferroelectric material, for example, lead zirconate titanate (PZT), PbZr/$TiO_3$, $BaTiO_3$, $PbTiO_2$, $HfO_2$, $Hf_{1-x}Zr_xO_2$, $ZrO_2$, $TiO_2$, NiO, $TaO_x$, $Cu_2O$, $Nb_2O_5$, $AlO_x$, etc. The memory layer 114 extends in the first direction (e.g., the X-direction) along the axial extent of the semiconductor die 100 in the first direction such that each semiconductor device 110 located in a row of the array of semiconductor devices 110 includes a portion of the memory layer 114, and the memory layer 114 is connected to each of the semiconductor devices 110 included in a corresponding row. In other embodiments, each of the semiconductor device includes a memory layer which extends from an axially outer edge of the source 120 to an opposite axially outer edge of the drain 122. As described with respect to the channel layer 116, while FIGS. 1-2 show two memory layers 114, a portion of each of which is included in each of the semiconductor devices 110 included in a row, in other embodiments, each semiconductor device 110 may include a single memory layer.

The semiconductor device 110 may include at least one gate layer disposed on a radially outer surface of the memory layer 114 in the second direction (e.g., the Y-direction), and extending in the first direction (e.g., the X-direction). For example, as shown in FIG. 1, the semiconductor die 100 also includes a stack 108 disposed on an outer surface of the memory layer 114, for example, on outer surfaces of each of the memory layer 114 included in each row of semiconductor devices 110, such that the stack 108 is interposed between adjacent rows of semiconductor devices 110. As shown in FIG. 1, the stack 108 includes a plurality of insulating layers 112, and a plurality of gate layers 124 alternatively stacked on top of one another in the vertical direction or the Z-direction. In some embodiments, a topmost layer and a bottommost layer of the stack 108 may include an insulating layer 112 of the plurality of insulating layers 112. The bottommost insulating layer 112 may be disposed on the substrate 107. The insulating layer 112 may include silicon nitride (SiN), silicon oxide (SiO), $SiO_2$, silicon carbide nitride (SiCN), silicon oxycarbonitride (SiOCN), silicon oxynitride (SiON), HfO2, $TaO_x$, $TiO_x$, $AlO_x$, etc. Moreover, the gate layer 124 may be formed from a conductive material such as a metal, for example, aluminum (Al), titanium (Ti), tungsten (W), copper (Cu), cobalt (Co), TiN, tantalum nitride (TaN), silver (Ag), gold (Au), nickel (Ni), chromium (Cr), hafnium (Hf), ruthenium (Ru), platinum (Pt), tungsten nitride (WN), etc., or a high-k dielectric material, for example, hafnium oxide (HfO), tantalum oxide ($TaO_x$), $TiO_x$ etc.

While FIG. 1 shows each gate layer 124 being associated with two semiconductor devices 110 located in opposite rows of the plurality of rows of the semiconductor devices 110, in other embodiments, two parallel gate layers may be located adjacent to each other in a second direction that is perpendicular to the first direction and in the same plane (e.g., the Y-direction), and may be interposed between two vertically separated insulating layers 112. Each gate layer 124 of the two parallel gate layers may be associated with a separate semiconductor devices 110, for example, each associated with a semiconductor device 110 located in rows of the semiconductor devices 110 that are parallel to each other. In some embodiments, an adhesive layer may be interposed between the gate layer/s 124 and the adjacent insulating layers 112, and facilitate adhesion of the gate layer 124 to the insulating layer 112, and may also serve as a spacer between two parallel gate layers 124 that are interposed between the same vertically separated insulating layers 112. In some embodiments, the adhesion layer (e.g., the adhesive layer) may include e.g., titanium (Ti), chromium (Cr), TiN, TaN, WN, or any other suitable adhesive material.

While not shown, driver lines may be coupled to the source 120 and the drain 122 of the semiconductor devices 110, and may provide electric charge to the source 120 and the drain 122. In some embodiments, a single driver line may be coupled to a set of sources 120 or a set of drains 122 of a plurality of semiconductor devices 110, which are located parallel to each other in the second direction (e.g., the Y-direction).

As previously described, inner spacers 118 that are formed from an insulating material may be disposed between the source 120 and the corresponding drain 122. When the semiconductor device 110 (e.g., a memory device) is activated by polarizing the gate layers 124, the inner spacer 118 between the source 120 and the drain 122, and a distance of drain 122 from the source 120 causes less electric field to flow across the channel layer 116 to the drain 122 to induce polarization switching, which may inhibit switching of memory to erase (ERS) mode from program (PGM) mode. This can cause small memory window and lead to reading failure of the memory. In some embodiments, each semiconductor device 110 included in the semiconductor die 100 includes at least one gate extension structure 123 (e.g., a pair of gate extension structures 123) disposed between a portion of the drain 122 and a corresponding portion of the channel layer 116.

The gate extension structure 123 extends from the drain 122 at least part way towards the source 120 in the first direction (e.g., the X-direction). The gate extension structure 123 is located proximate to the channel layer 116 and is in contact with the channel layer 116, as shown in FIGS. 2-4. For example, the gate extension structure 123 may be disposed proximate to at least one radially outer edge of the drains 122 in the second direction (e.g., the Y-direction), and is disposed radially outwards of a radially outer surface of the drain 122 and in contact with the channel layer 116. The gate extension structure 123 may be formed from a dielectric material, for example, SiN, $HfO_2$, $TaO_x$, $TiO_x$, $AlO_x$, etc. The dielectric material may be different from the material that forms the inner spacers 118 and, in some embodiments, may have a high etch selectivity to the material from which the inner spacers 118 are formed. Each drain 122 includes two gate extension structures 123 disposed between the drain 122 and opposing channel layers 116 included in the semiconductor device 110.

A contact structure is interposed between the channel layer 116 and at least a portion of the source 120 and/or the drain 122, the contact structure having a lower resistance than the channel layer 116. For example, as shown in FIGS. 1-4, a first contact structure 121 is wrapped around the drain 122 (e.g., wrapped in the X and Y directions), and a second contact structure 126 is wrapped around the source 120 (e.g., wrapped in the X and Y directions). The first contact structure 121 is wrapped around the drain 122 such that a first portion of the first contact structure 121, which is disposed axially outwards of a radially outward edge 123-1 of the gate extension structure 123, is interposed between the channel layer 116 and the drain 122, and a second portion of the first contact structure 121 is interposed between the gate extension structure 123 and the drain 122. Similarly, a portion of the second contact structure 126 is interposed between the channel layer 116 and the source 120.

The first contact structure 121 and the second contact structure 126 have a lower resistance than the channel layer 116. As previously described, it is desirable to form an ohmic contact between the channel layer 116 and the source 120 and drain 122, respectively. However, too low a resistance of the channel layer 116 may result in negative transition voltage of the semiconductor device 110, which is undesirable. However, having the low resistance (e.g., low RC value) first contact structure 121 interposed between channel layer 116 and the drain 122, and the second contact structure 126 interposed between the channel layer 116 and the source 120 results in each of the channel layer 116 having an ohmic contact between the channel layer 116 and first and second contact structures 121, 126, and the drain 122, and the source 120 having an ohmic contact with the first and second contact structures 121, 126, respectively. This greatly reduces contact resistance between the channel layer 116, and the source 120 and drain 122, while allowing the semiconductor device 110 to advantageously have a positive transition voltage. In other words, the first and second contact structures 121, 126 reduce barrier height for the channel layer 116, for example, by allowing tuning of the work-function based on the resistances of the channel layer 116 material.

The first and second contact structures 121, 126 have a lower resistance than the channel layer 116. In some embodiments, a first ratio of the resistance between the channel layer 116 and the contact material forming the first and second contact structures 121, 126 is in a range of 1:0.5 to 1:0.01, for example, 1:0.5, 1:0.4, 1:0.3, 1:0.2, 1:0.1, 1:0.08, 1:0.06 1:0.04, 1:0.02, or 1:0.01, inclusive. These ranges are just examples, and any other ranges and values of the first ratio are contemplated and are within the scope of this disclosure.

In some embodiments, the first and second contact structures may include a metal, for example, Al, Ti, TiN, TaN, Co, Ag, Au, Cu, Ni, Cr, Hf, Ru, W, Pt, WN, Ru, any other suitable material or any suitable combination thereof. In embodiments in which the source 120 and the drain 122 also include a metal, the metal of the source 120 and the drain 122 may be different from the metal of the contact structures 121, 126.

In some embodiments, the first and second contact structures 121, 126 may include a semiconductor material, for example, IGZO, ITO, IZO, ZnO, IWO, poly-silicon or amorphous silicon (n-type or p-type), Ge, SiGe, any other suitable semiconductor material or any other suitable combination thereof. In embodiments in which the channel layer 116 also includes a semiconductor material, the first and second contact structures 121, 126 may be doped with a second concentration of a dopant (e.g., an n-type or p-type dopant) which is higher than the first concentration of the dopant, which may be same or different than the dopant doping the channel layer 116. In some embodiments, a second ratio between the second concentration of the dopant to the first concentration of the dopant is 2:1 to 100:1, inclusive (e.g., 2:1, 4:1:6:1, 8:1, 10:1, 15:1, 20:1, 25:1, 30:1, 35:1, 40:1, 45:1, 50:1, 60:1, 70:1, 80:1, 90:1, or 100:1, inclusive). However, other ranges and values are contemplated and are within the scope of this disclosure. The first ratios and second ratios may be selected to allow ohmic contacts to be formed between the channel layer 116, and the source 120 and the drain 122, without over doping of the contact structures 121, 126 so as to reduce fabrication time and cost. In various embodiments, the semiconductor material of the channel layer 116, and the first and second contact structures 121, 126 may be same or different.

As shown in FIGS. 1-2, a pair of gate extension structure 123 are associated with the drain 122. The gate extension structures 123 may be substantially identical to each other in structure and function. The pair of gate extension structures 123 are disposed proximate to opposite radially outward edges 122-4 of the drain 122 (FIG. 4) and in contact with the channel layer 116 and corresponding first contact structure 121. In some embodiments as shown in FIG. 4, a first axial end 123-1 of the gate extension structure 123 is disposed axially outwards of an axially inward edge 121-1 of the first contact structure 121 that is proximate to the source 120 in the first direction (e.g., the X-direction), and a second axial end 123-2 of the gate extension structure 123 opposite the first axial end 123-1 is axially aligned with the axially inward edge 121-1 of the first contact structure 121. In other embodiments, the second axial end 123-2 of the gate extension structure 123 may extend inward beyond the axially inward edge 121-1 of the first contact structure 121, for example, part way, or up to an axially inward edge 126-1 of the second contact structure 126.

As shown in FIG. 4, the first axial end 123-1 of the gate extension structure 123 is bounded in the first direction by the first contact structure 121, a first radial edge 123-3 of the gate extension structure 123 is also bounded by the first contact structure 121 in the second direction, the second axial end 123-2 is bounded by the inner spacer 118 (not shown in FIG. 4 for clarity), and a second radial edge 123-4 of the gate extension structure 123 is bounded by the corresponding channel layer 116.

In semiconductor devices that do not include the gate extension structure, a gate length $L_g$ is defined by a distance between corresponding edges of the source 120 and the drain 122, i.e., the width of the inner spacer 118. The amount of electric field that passes across the channel layer 116 to the drain to cause polarization switching of the memory layer 114 may depend upon the gate length $L_g$. Because the inner spacer 118 that is formed from an insulating material is disposed between the source 120 and the corresponding drain 122, there is small window proximate to where the drain 122 is located proximate to the inner spacer 118 where the electric field flows across the channel layer 116 to the drain 122. The inner spacer 118 inhibits the electric field, which can lead to inhibition of memory state from ERS to PGM due to less electric field across the channel layer 116. One option may be to reduce gate length $L_g$. However, positioning the drain 122 too close to the source 120 may cause punch through of charge from the source 120 to the drain 122, or process limitations may limit how close the drains 122 may be positionable relative to the source 120.

In contrast, the gate extension structures 123 of the semiconductor device 110 improve the electric field across the channel layer 116 which facilitates polarization switching in the channel layer 116, reducing memory read failure. The gate extension structures 123 extend the gate length by the length (or a portion of the length) of the gate extension structures 123 that extend axially outwards of the axially inward edge 121-1 of the first contact structure 121, i.e., extends the gate length $L_g$ to beyond the extent of the inner spacer 118.

In some embodiments, the gate length $L_g$ may be in a range of 5 nm to 500 nm, or any other suitable range or value. In some embodiments, a source contact length SCT of the second contact structure 126 in the first direction, which may define a contact length of the second contact structure 126 and thereby, the source 120 with the channel layer 116 disposed adjacent thereto may be in a range of 5 nm to 500 nm, inclusive, or any other suitable range or value. In some embodiments, a drain contact length DCT of the first contact structure 121 of the first contact structure 121 that corresponds to a contact length of the first contact structure 121 and thereby, the drain 122 with the corresponding channel layer 116 may be in a range of 5 nm to 500 nm, inclusive, or any other suitable range.

In some embodiments, DCT>SCT. In other embodiments, DCT=SCT. In still other embodiments, DCT<SCT. The relative ratio of the DCT to the SCT may be based on contact resistance of the source 120 and drain 122, and or the contact structures 121, 126 material to the channel layer 116 material, and fabrication process limitations. In some embodiments, gate length $L_g$>(DCT or SCT). In other embodiments, gate length $L_g$=(DCT or SCT). In still other embodiments, $L_g$<(DCT or SCT). In some embodiments, a ratio of a thickness of the gate extension structures 123 to a thickness of the channel layers 116 may be in a range of about 5% to about 90%, inclusive, or any other suitable range.

As shown in FIG. 4, the gate extension structure 123 has a length $L_{ge}$ that is smaller than the gate length $L_g$. While the second axial end 123-2 of the gate extension structure 123 is shown as being axially aligned with the axially inward edge 121-1 of the first contact structure 121, in some embodiments, the gate extension structure 123 may extend part way towards an axially inward edge 126-1 of the second contact structure 126 such that the second axial end 123-2 is located axially inward of the axially inward edge 126-1 of the second contact structure 126. Moreover, while FIG. 4 shows the gate extension structure 123 being disposed radially outwards of the channel layer 116, in other embodiments, the gate extension structure 123 may be disposed substantially within the channel layer 116, for example, bounded at least partially on the ends 123-1 and 123-2, and the edge 123-4 by the channel layer 116 (e.g., bounded on three sides by the channel layer 116).

The gate extension structure 123 causes the drain 122 to have an asymmetric shape. For example, as shown in FIG. 2, the drain 122 has different widths in the second direction (e.g., the Y-direction) at different locations. For example, as shown in FIG. 2, the drain 122 has a drain first width W1 in the second direction at locations proximate to the gate extension structure 123, and a drain second width W2 in the second direction at locations distal from the gate extension structure 123. The drain second width W2 is larger than the drain first width W1. In some embodiments, a third ratio between the drain second width W2 and the drain first width W1 (W2:W1) may be in range of 1.1:1 to 2:1, inclusive, and is based on a width of the gate extension structure. Other ranges and values are contemplated and are within the scope of this disclosure.

In the embodiment shown in FIGS. 1-4, the first contact structure 121 has a first contact structure width D1 which is about equal to a second contact structure width D2 of the second contact structure 126. For example, the first and second contact structures 121, 126 may be formed during the same fabrication process causing the first contact structure width D1 and the second contact structure width D2 to be about equal to each other.

Figure 5:
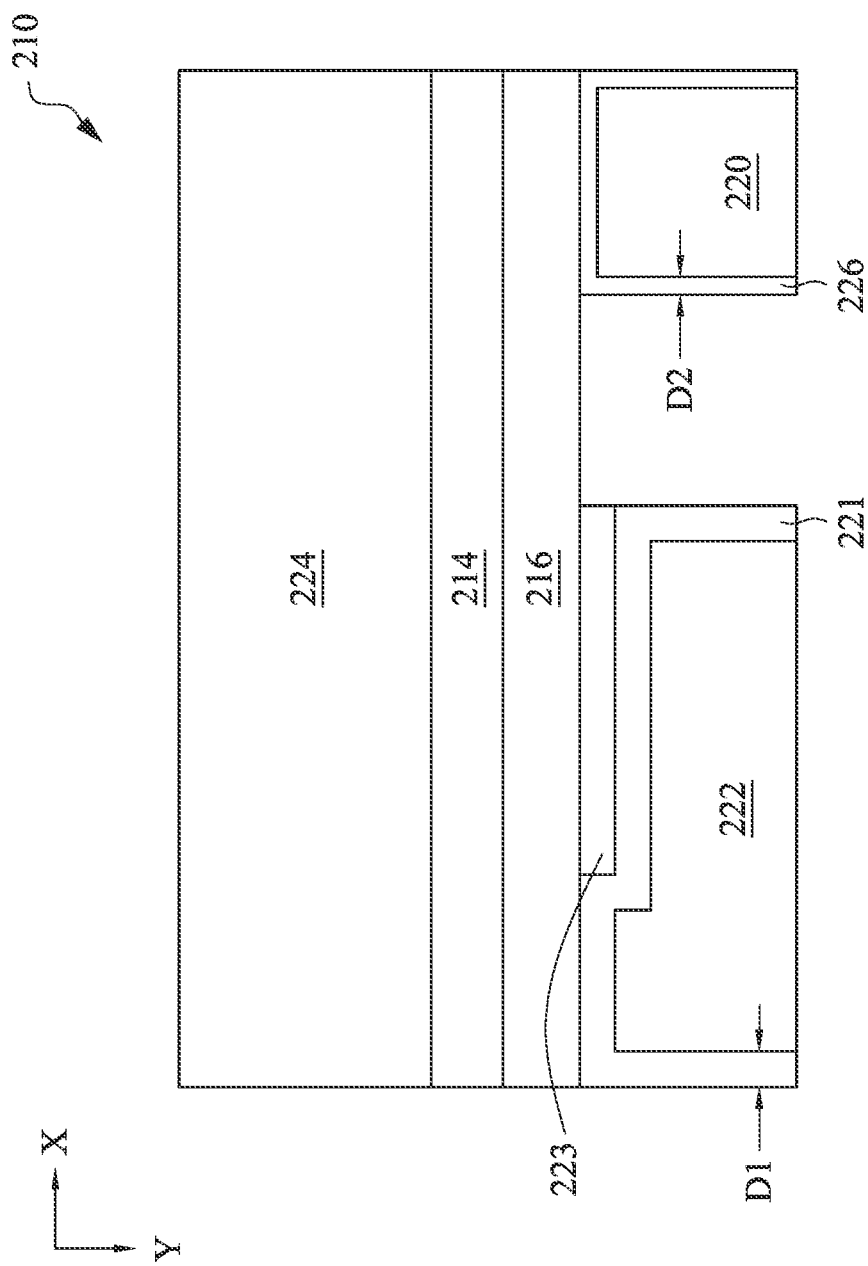
FIGS. 5 and 6 are top cross-sectional views of portions of a semiconductor devices, according to various embodiments.

In other embodiments, the first contact structure width D1 may be different from the second contact structure width D2. For example, FIG. 5 is a top cross-sectional view of a portion of a semiconductor device 210, according to another embodiment. The semiconductor device 210 is substantially similar to the semiconductor device 110 and includes a source 220, a drain 222, a first contact structure 221, a second contact structure 226, a gate extension structure 223, a channel layer 216, a memory layer 214, at least one gate layer 224, and may also include any other structures as described with respect to the semiconductor device 110. However, different from the semiconductor device 110, a first contact structure width D1 of the first contact structure 221 is larger than a second contact structure width D2 of the second contact structure 226. For example, a fourth ratio of the first contact structure width D1 to the second contact structure width D2 (i.e., D1:D2) may be in a range of 3:1 to 1.5:1, inclusive. Other ranges and values are contemplated and are within the scope of this disclosure.

Figure 6:
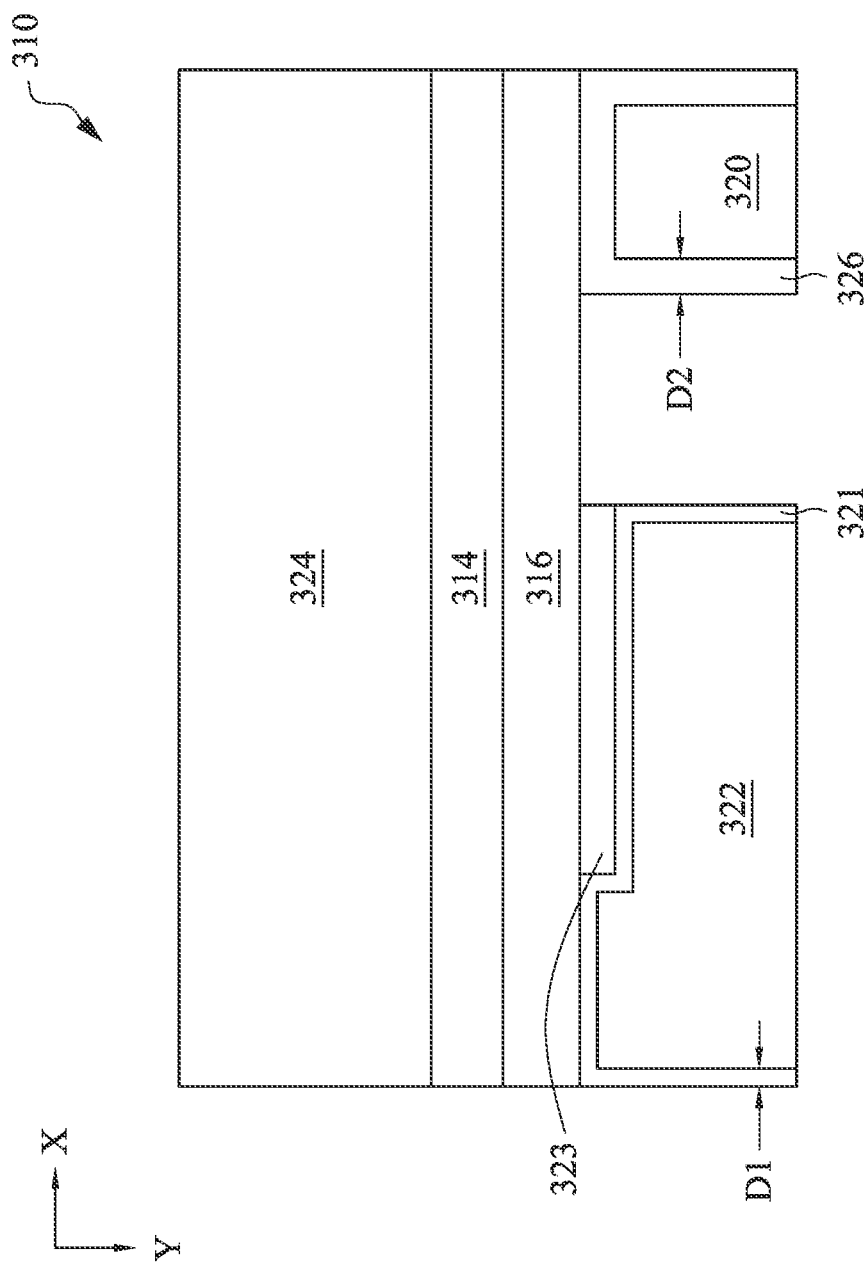

FIG. 6 is a top cross-sectional view of a portion of a semiconductor device 310, according to still another embodiment. The semiconductor device 310 is substantially similar to the semiconductor device 110 and includes a source 320, a drain 322, a first contact structure 321, a second contact structure 326, a gate extension structure 323, a channel layer 316, a memory layer 314, at least one gate layer 324, and may also include any other structures as described with respect to the semiconductor device 110. However, different from the semiconductor device 110, a first contact structure width D1 of the first contact structure 321 is smaller than a second contact structure width D2 of the second contact structure 326. For example, the fourth ratio of D1:D2 may be in a range of 1:3 to 1:1.5, inclusive. Other ranges and values are contemplated and are within the scope of this disclosure.

Figure 7:
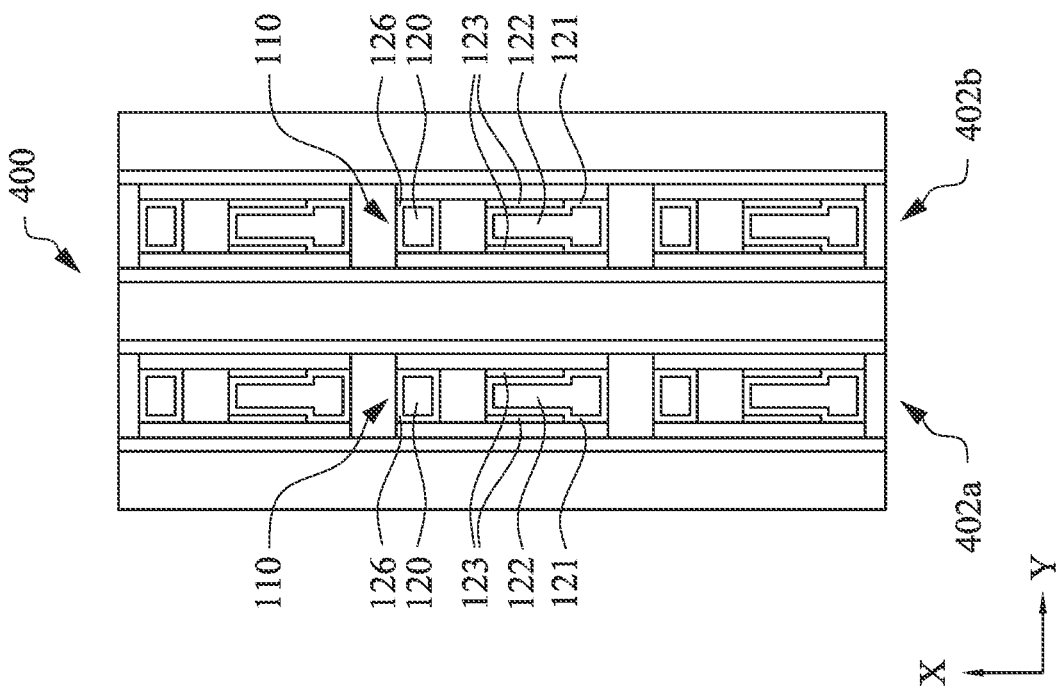

Each semiconductor die can include any number of semiconductor devices that may be arranged in rows and in any suitable configuration. For example, FIG. 7 is a top view of a portion of a semiconductor die 400, according to an embodiment. The semiconductor die is substantially similar to the semiconductor die 100. The semiconductor die 400 includes a first row 402a and second row 402b of semiconductor devices 110, which are parallel to each other. Each of the semiconductor devices 110 disposed in the first row 402a of the semiconductor die 100 is parallel to and axially aligned in a first direction (e.g., the X-direction) with another semiconductor device 110 disposed in the second row 402b that is parallel to the first row 402a in the second direction (e.g., the Y-direction). This causes the first and second contract structures 121, 126, as well as the gate extension structures 123 of each of the semiconductor device 110 included in the first row 402a to be axially aligned with corresponding first and second contract structures 121, 126, and gate extension structures 123 of corresponding semiconductor devices 110 included in the second row 402b in the first direction.

Figure 8:
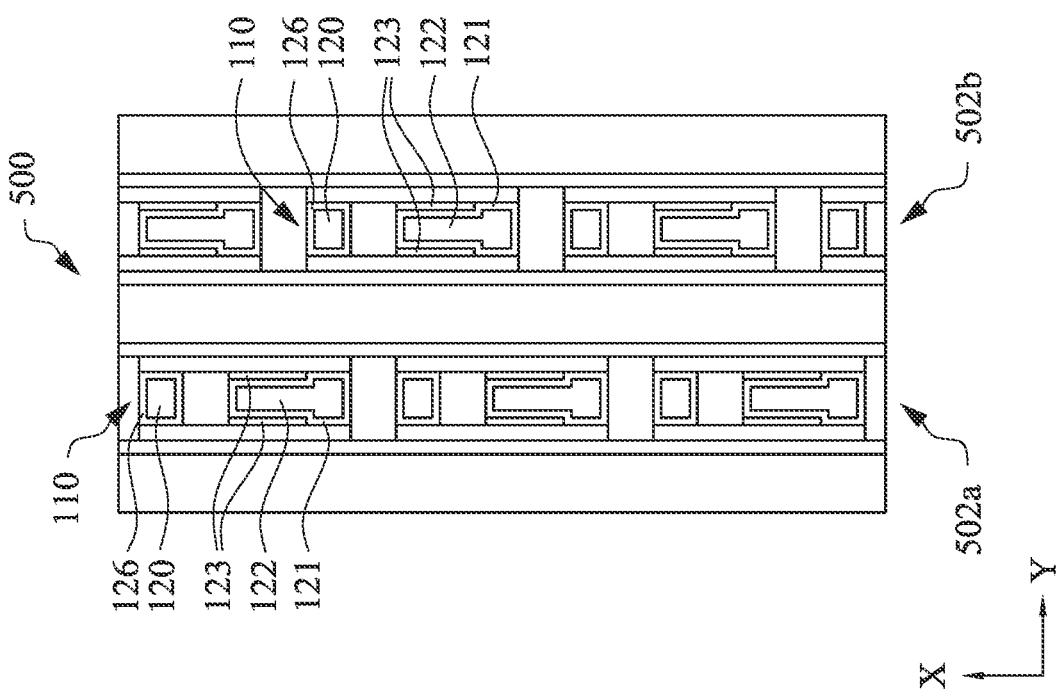
FIGS. 7-10 are top views of portions of semiconductor dies including a plurality of rows of semiconductor devices, according to various embodiments.

FIG. 8 is a top view of a portion of a semiconductor die 500, according to another embodiment. The semiconductor die 500 includes a first row 502a and second row 502b of semiconductor devices 110, which are parallel to each other. The semiconductor die 500 is similar to semiconductor die 400 with the difference that each of the semiconductor devices 110 disposed in the first row 502a of the semiconductor die 500 is parallel to and axially offset (e.g., by at least about half of an axial length of the semiconductor device 110 in the second direction, or any other suitable offset distance) in a first direction (e.g., the X-direction) with another semiconductor device 110 disposed in the second row 502b that is parallel to the first row 502a in the second direction (e.g., the Y-direction). This causes first and second contact structures 121, 126, as well as the gate extension structures 123 of each of the semiconductor device 110 included in the first row 502a to be axially offset with corresponding first and second contact structures 121, 126, and gate extension structures 123, respectively of corresponding semiconductor devices 110 included in the second row 502b (e.g., by at least about half of an axial length of the semiconductor device 110 in the second direction, or any other suitable offset distance). Offsetting may reduce fabrication complexity by creating more space when communication lines or leads are coupled or routed to the source 120 and the drain 122 of the semiconductor devices 110.

Figure 9:
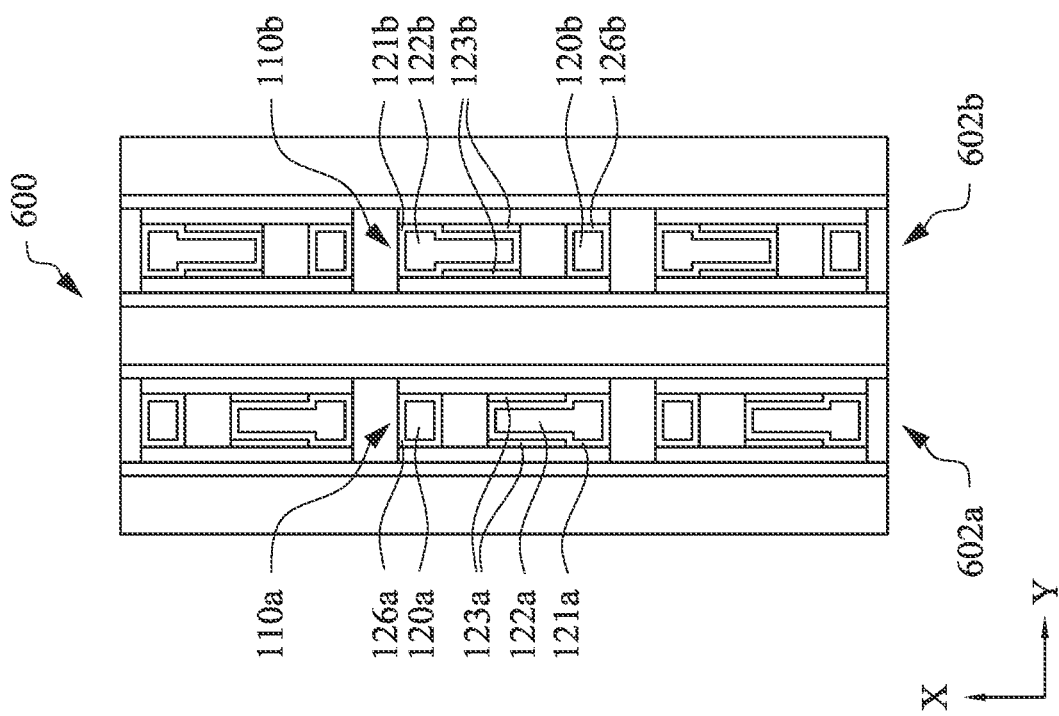

Each of the semiconductor devices 110 included in the semiconductor dies 100, 400, and 500 within each of the rows of the semiconductor devices 110 (e.g., the rows 402a, 402b, 502a, 502b), are oriented in the same orientation. For example, as shown in FIGS. 1 and 7-8, the location of a source 120 relative to a drain 122 of each of the semiconductor devices 110 is the same in the semiconductor dies 100, 400, and 500. In other embodiments, an orientation of a semiconductor device 110 in one row may be different from an orientation of a semiconductor device 110 located in a parallel row. For example, FIG. 9 is a top view of a portion of a semiconductor die 600, according to an embodiment. The semiconductor die 600 includes a first row 602a and second row 602b of semiconductor devices 110a/110b, which are parallel to each other. Each of the semiconductor devices 110a/b within the first row 602a/b include a source 120a/b, a drain 122a/b, a first contact structure 121a/b, a second contact structure 126a/, and gate extension structures 123a/b. The semiconductor devices 110a disposed in the first row 602a of the semiconductor die 100 are parallel to and axially aligned in a first direction (e.g., the X-direction) with another semiconductor device 110b disposed in the second row 602b that is parallel to the first row 602a in the second direction (e.g., the Y-direction). However, each semiconductor device 110a disposed in the first row 602a is oriented in a first orientation, and each semiconductor device 110b in the second row 602b is oriented in a second orientation that is opposite to the first orientation, for example, 180 degrees rotated with respect to the first orientation. This causes the source 120b, the drain 122b, the first and second contract structures 121b, 126b, as well as the gate extension structures 123b of each of the semiconductor device 110b in the second row 602b to be oriented opposite to the first orientation of the source 120a, the drain 122a, the first and second contact structures 121a, 126a, as well as the gate extension structures 123a of each of the semiconductor device 110a in the first row 602a.

Figure 10:
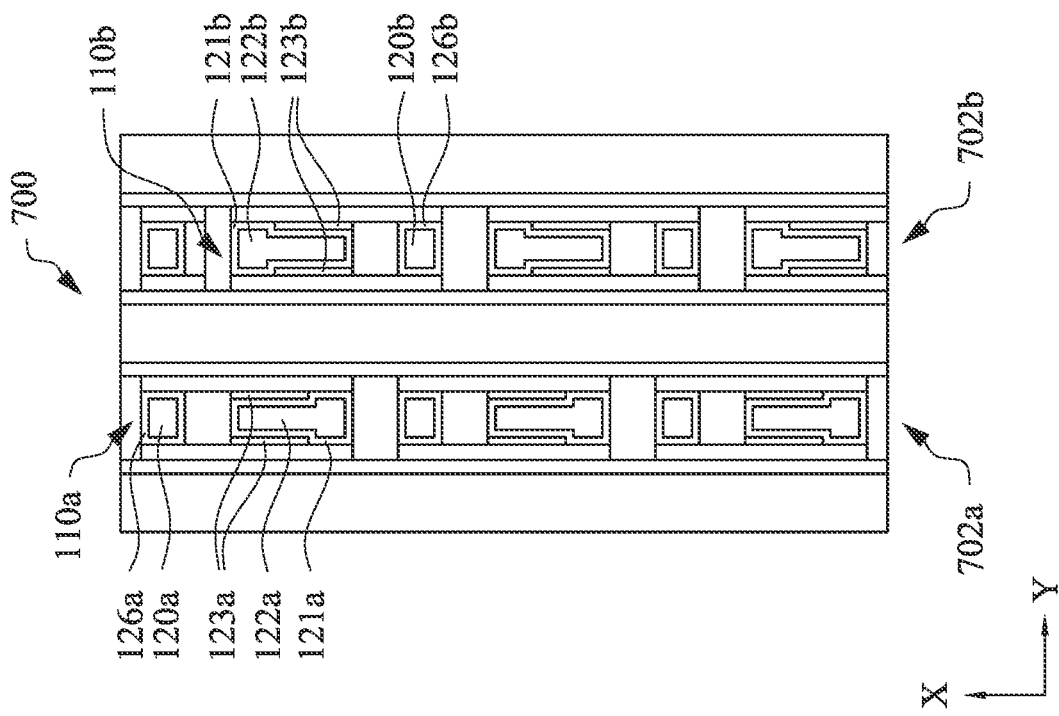

FIG. 10 is a top view of a portion of a semiconductor die 700, according to another embodiment. The semiconductor die 700 includes a first row 702a and second row 702b of semiconductor devices 110a and 110b, respectively, which are parallel to each other. Similar to the semiconductor die 600, each semiconductor device 110a disposed in the first row 702a of the semiconductor die 700 is oriented in a first orientation, and each semiconductor device 110b in the second row 702b is oriented in a second orientation that is opposite to the first orientation, for example, 180 degrees rotated with respect to the first orientation. However, different from the semiconductor die 600, each of the semiconductor devices 110*a* disposed in the first row 702*a* of the semiconductor die 100 is parallel to and axially offset (e.g., by at least about half of an axial length of the semiconductor device 110*a/b*, or any other suitable offset distance) in a first direction (e.g., the X-direction) with another semiconductor device 110*b* disposed in the second row 702*b* that is parallel to the first row 702*a* in the second direction (e.g., the Y-direction).

Figure 11A:
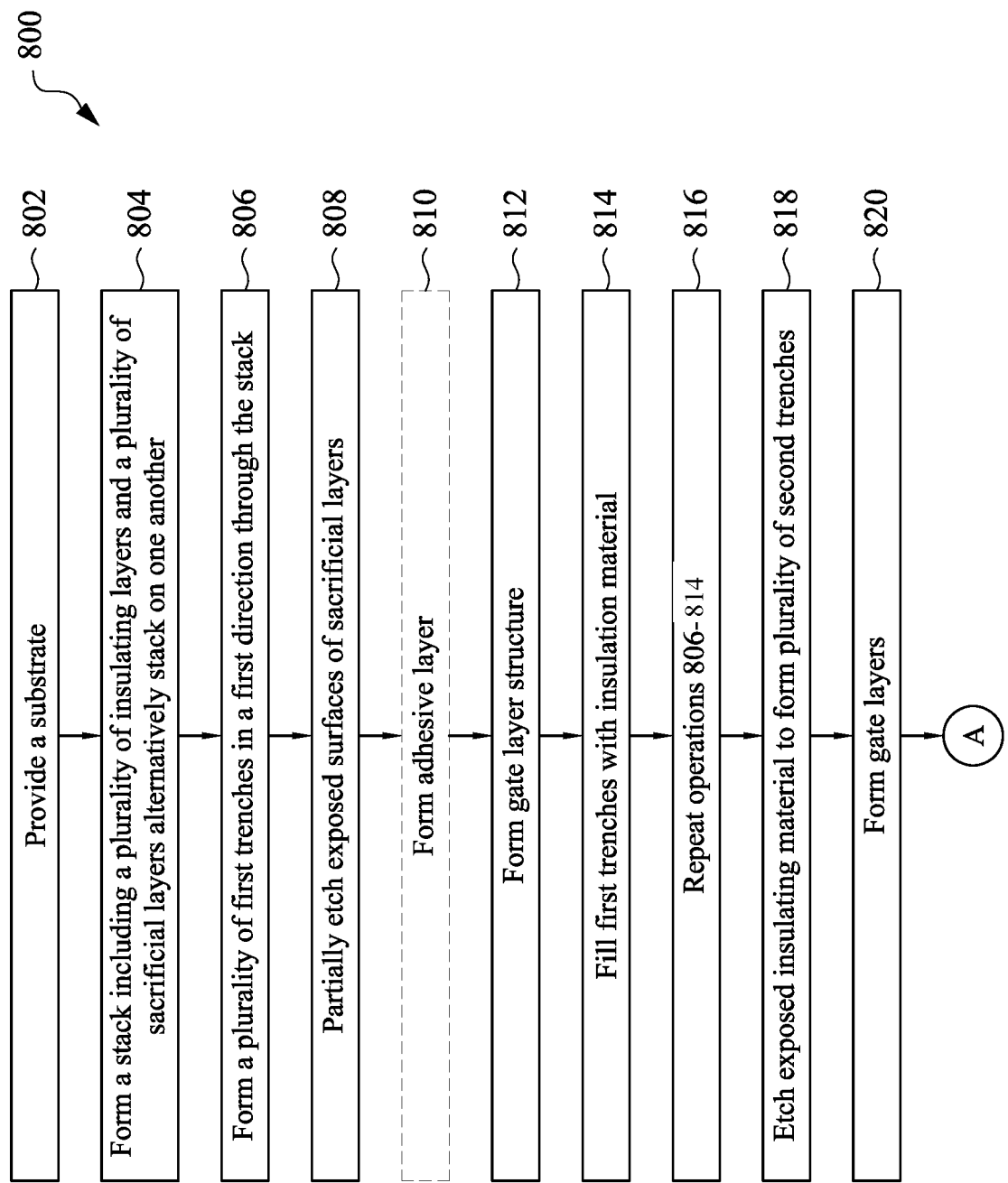
FIGS. 11A-11C are schematic flow charts of a method for forming a semiconductor die, according to an embodiment.
Figure 11B:
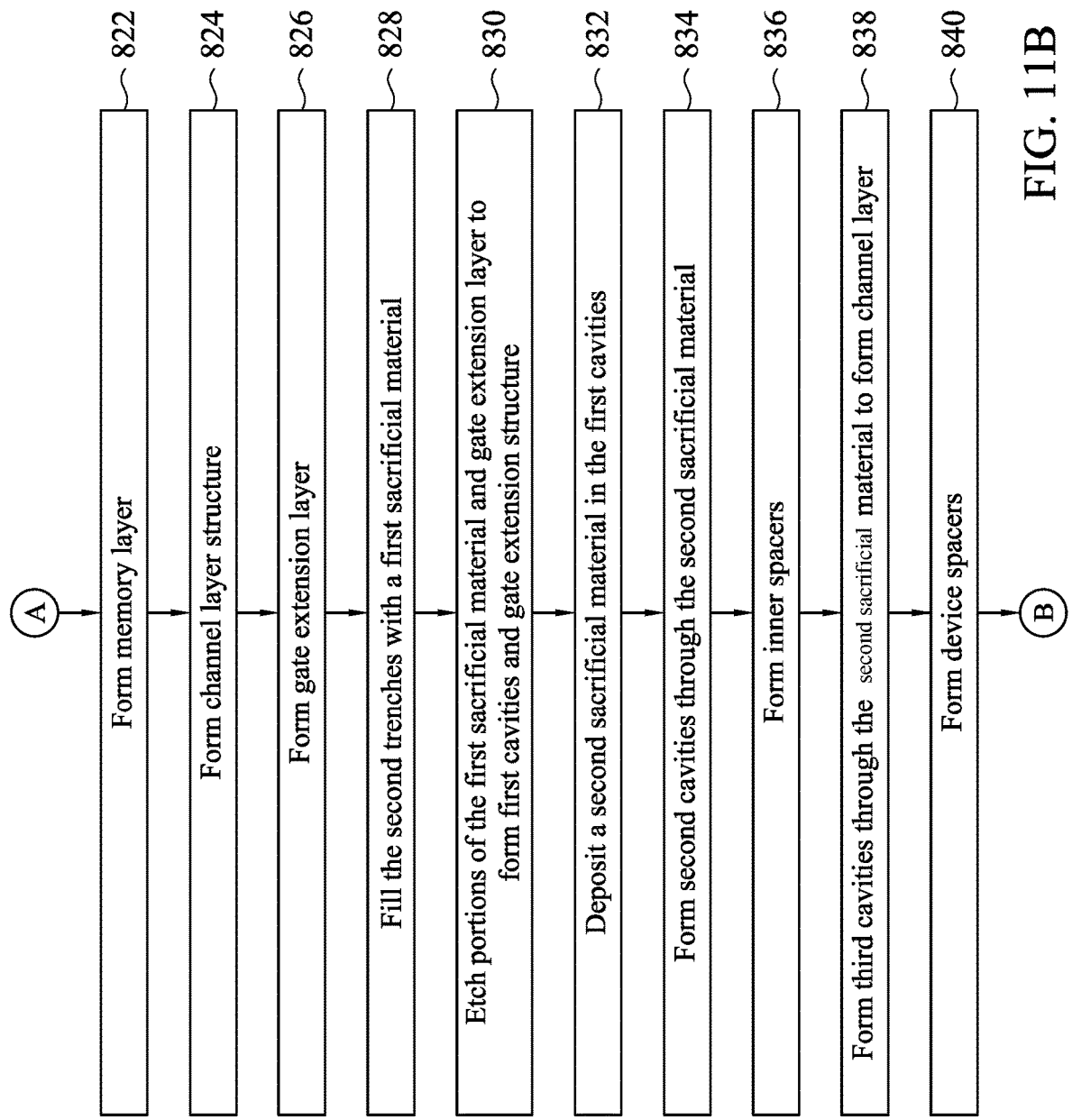
Figure 11C:
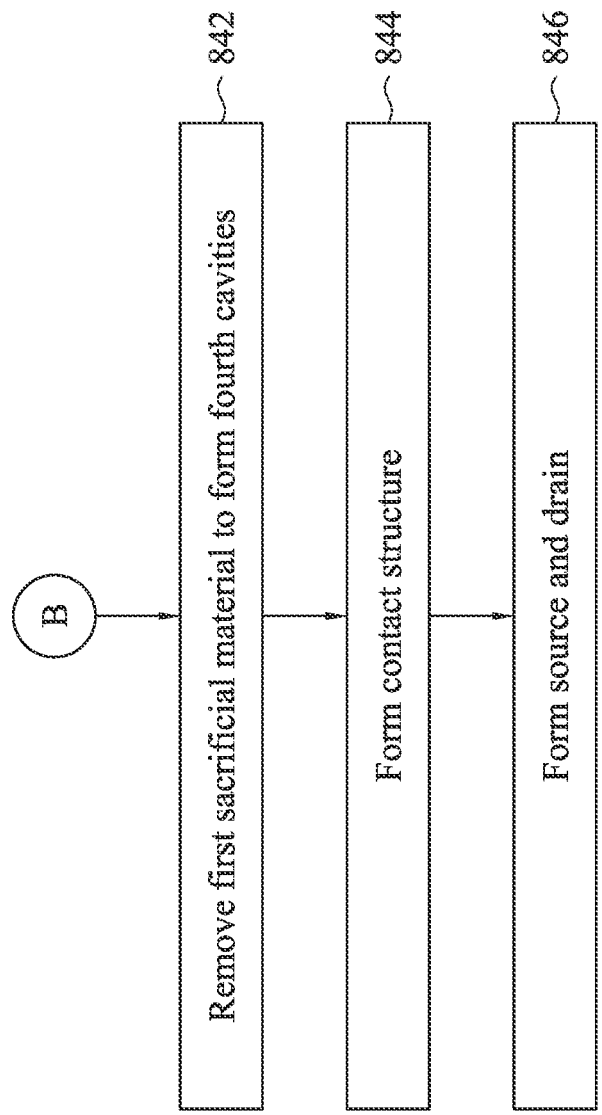

FIGS. 11A-11C illustrate a flowchart of a method 800 for forming a semiconductor die 900, for example, a die including a plurality of 3D memory devices (e.g., any of the semiconductor devices described with respect to FIGS. 1-10), according to an embodiment. For example, at least some of the operations (or steps) of the method 800 may be used to form a semiconductor die including a plurality of 3D memory device (e.g., the semiconductor device 110, 210, 310), a nanosheet transistor, a nanowire transistor deice, a vertical transistor device, or the like. It should be noted that the method 800 is merely an example, and is not intended to limit the present disclosure. Accordingly, it is understood that additional operations may be provided before, during, and after the method 800 of FIGS. 11A-11C, and that some other operations may only be briefly described herein. In some embodiments, operations of the method 800 may be associated with perspective views of the example semiconductor die at various fabrication stages as shown in FIGS. 12, 13, 14, 15, 16, 17, 18, 19, 20, 21, 22, and 23 in some embodiments are represented with respect to a semiconductor die 900 that represents a 3D memory device, the operations are equally applicable to any other semiconductor device, for example, the semiconductor dies 100, 400, 500, 600, 700 shown in FIGS. 1-10 or any other semiconductor die (e.g., a GAA FET device, a nanosheet transistor device, a nanowire transistor device, a vertical transistor device, etc.). Although FIGS. 12-23 illustrate the semiconductor die 900 including the plurality of semiconductor devices 110, it is understood the semiconductor die 900 may include a number of other devices such as inductors, fuses, capacitors, coils, etc., which are not shown in FIGS. 12-23 for purposes of clarity of illustration.

The method 800 may generally include providing a stack comprising a plurality of insulating layers and a plurality of sacrificial layers alternatively stacked on top of each other, the stack extending in a first direction (e.g., the X-direction). The method 800 also includes forming a plurality of gate layers by replacing the plurality of sacrificial layers. A memory layer is formed that extends along the first direction radially inwards of and coupled to the plurality of gate layers in a second direction (e.g., the Y-direction) perpendicular to the first direction. A channel layer is formed that extends along the first direction and is coupled to a radially inner surface of the memory layer in the second direction. The method 800 also includes forming a contact structure having a lower resistance than the channel layer, and forming a source and a drain spaced apart from the source in the first direction, such that the contact structure is interposed between the channel layer and at least a portion of the source and/or the drain. The contact structure may include a first contact structure wrapped around the drain, and a second contact structure wrapped around the source. In some embodiments, the method 800 also includes forming gate extension structures extending along portions of the channel layer in the first direction, and coupled to a radially inner surface of the channel layer. A portion of the first contact structure is interposed between the gate extension structure and the drain.

Expanding further the method 800 starts with operation 802 that includes providing a substrate, for example, the substrate 107 shown in FIGS. 1 and 12-23. The substrate 107 may be a semiconductor substrate, such as a bulk semiconductor, a semiconductor-on-insulator (SOI) substrate, or the like, which may be doped (e.g., with a p-type or an n-type dopant) or undoped. The substrate 107 may be a wafer, such as a silicon wafer. Generally, an SOI substrate includes a layer of a semiconductor material formed on an insulator layer. The insulator layer may be, for example, a buried oxide (BOX) layer, a SiO layer, a SiN layer, or the like. The insulator layer is provided on a substrate, typically a silicon or glass substrate. Other substrates, such as a multi-layered or gradient substrate may also be used. In some embodiments, the semiconductor material of the substrate 107 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP, any other suitable semiconductor material, or combinations thereof.

Figure 12:
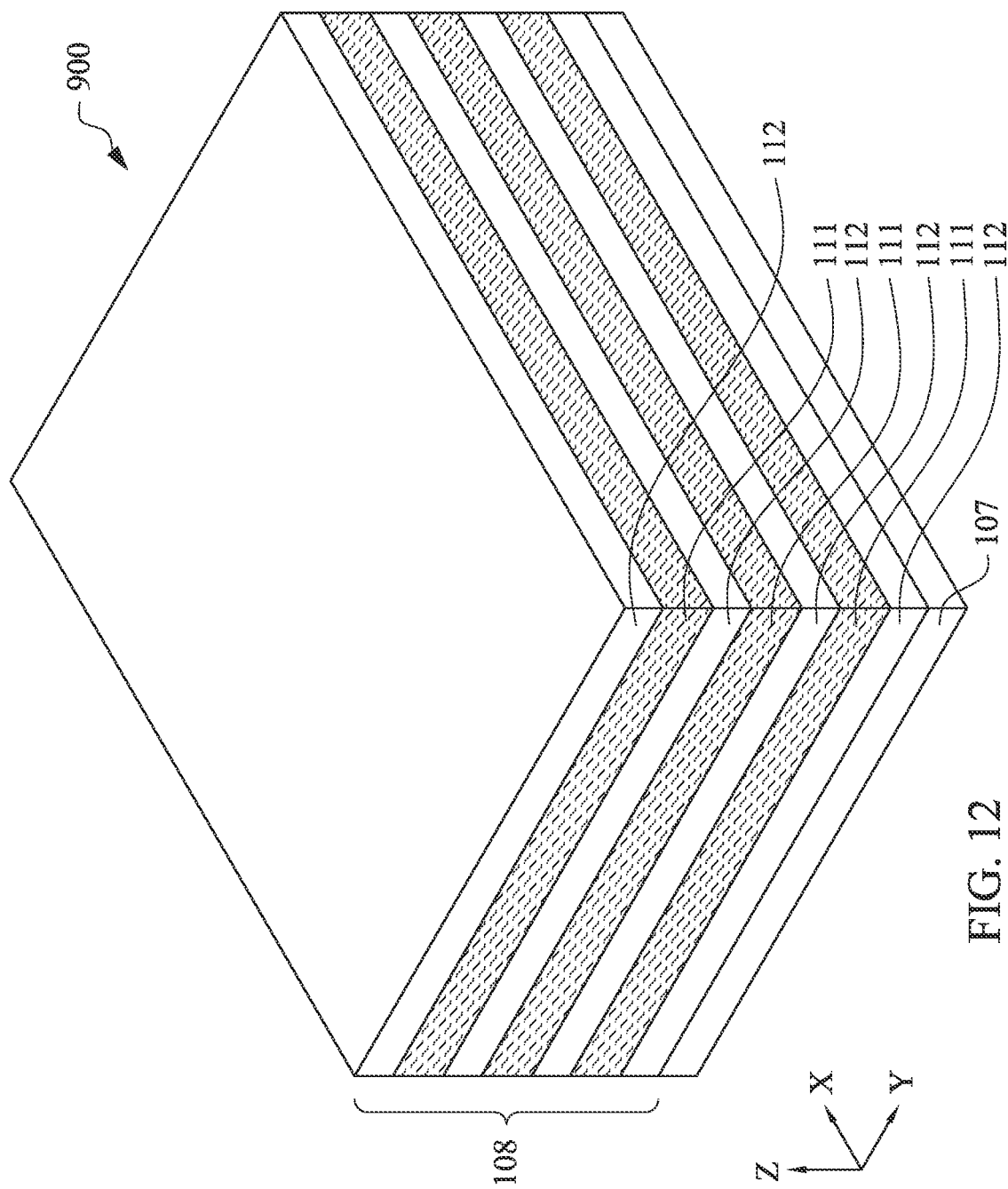
FIGS. 12, 13, 14, 15, 16, 17, 18, 19, 20, 21, 22, and 23 illustrate various views of an example semiconductor die (or a portion of the example semiconductor die) during various fabrication stages, made by the method of FIGS. 11A-11C, in accordance with some embodiments.

At 804, a stack (e.g., the stack 108 shown in FIG. 12) is formed on the substrate. The stack includes a plurality of insulating layers (e.g., the insulating layers 112) and a plurality of sacrificial layers (e.g., the sacrificial layers 111 shown in FIG. 12) alternately stacked on top of each other in the vertical direction (e.g., the Z-direction). Corresponding to operations 802-804, FIG. 12 is a top, perspective view of the stack 108 disposed on the substrate 107. The insulating layers 112 and the sacrificial layers 111 are alternately disposed on top of one another in the Z-direction. For example, one of the sacrificial layers 111 is disposed over one of the insulating layers 112, then another one of the insulating layers 112 is disposed on the sacrificial layer 111, so on and so forth. As shown in FIG. 12, a topmost layer (e.g., a layer distal most from the substrate 107) and a bottommost layer (e.g., a layer most proximate to the substrate 107) of the stack 108 may include an insulating layer 112. While FIG. 12 shows the stack 108 as including four insulating layers 112 and three sacrificial layers 111, the stack 108 may include any number of insulating layers 112 and sacrificial layers 111 (e.g., 4, 5, 6, 7, 8, or even more). In various embodiments, if the number of sacrificial layers 111 in the stack 108 is n, a number of insulating layers 112 in the stack 108 may be n+1.

Each of the plurality of insulating layers 112 may have about the same thickness, for example, in a range of about 5 nm to about 100 nm, inclusive, or any other suitable thickness. Moreover, the sacrificial layers 111 may have the same thickness or different thickness from the insulating layers 112. The thickness of the sacrificial layers 111 may range from a few nanometers to few tens of nanometers (e.g., in a range of 5 nm to 100 nm, inclusive, or any other suitable thickness).

The insulating layers 112 and the sacrificial layers 111 have different compositions. In various embodiments, the insulating layers 112 and the sacrificial layers 111 have compositions that provide for different oxidation rates and/or different etch selectivity between the respective layers. In some embodiments, the insulating layers 112 may be formed from SiO, and the sacrificial layers 111 may be formed from SiN. In various embodiments, the insulating layers 112 may be formed from any suitable first material (e.g., an insulating material) as described with respect to the semiconductor device 110, and the sacrificial layers 111 may be formed from a second material (e.g., also an insulating material) that is different from the first material. In some embodiments, the sacrificial layers may include SiN, $HfO_2$, $TaO_x$, $TiO_x$, $AlO_x$, or any other material that has a high etch selectivity relative to the insulating layers 112 (e.g., an etch selectivity ratio of at least 1:100, or any other suitable etch selectivity ratio). The sacrificial layers 111 are merely spacer layers that are eventually removed and do not form an active component of the semiconductor die 900.

In various embodiments, the insulating layers 112 and/or the sacrificial layers 111 may be epitaxially grown from the substrate 107. For example, each of the insulating layers 112 and the sacrificial layers 111 may be grown by a molecular beam epitaxy (MBE) process, a chemical vapor deposition (CVD) process such as a metal organic CVD (MOCVD) process, a furnace CVD process, and/or other suitable epitaxial growth processes. During the epitaxial growth, the crystal structure of the substrate 107 extends upwardly, resulting in the insulating layers 112 and the sacrificial layers 111 having the same crystal orientation as the substrate 107. In other embodiments, the insulating layers 112 and the sacrificial layers 111 may be grown using an atomic layer deposition (ALD) process.

The method 800 also includes forming a plurality of gate layers by replacing the plurality of sacrificial layers as described with respect to operations 806-820. While operations 806-820 describe a particular method of forming the plurality of gate layers, any other suitable method may be used to replace the plurality of sacrificial layers (e.g., the sacrificial layers 111) with the plurality of gate layers (e.g., the plurality of gate layers 124 shown in FIG. 13) and should be considered within the scope of this disclosure. For example, at 806 a plurality of first trenches may be formed through the stack in the first direction (e.g., the X-direction), the trenches extending from the topmost insulating layer 112 to the substrate 107. The etching process for forming the plurality of first trenches may include a plasma etching process, which can have a certain amount of anisotropic characteristic. For example, the first trenches may be formed, for example, by depositing a photoresist or other masking layer on a top surface of the semiconductor die 900, i.e., the top surface of the topmost insulating layer 112 of the stack 108, and a pattern corresponding to the first trenches defined in the masking layer (e.g., via photolithography, e-beam lithography, or any other suitable lithographic process). In other embodiments, a hard mask may be used.

Subsequently, the stack 108 may be etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the first trenches. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated. The etch used to form the plurality of first trenches etches through each of the sacrificial layers 111 and insulating layers 112 of the stack 108 such that each of the plurality of first trenches extend form the topmost insulating layer 112 through the bottommost insulating layer 112 to the substrate 107.

At operation 808, exposed surfaces of the sacrificial layers within the trenches are partially etched so as to reduce a width of the sacrificial layers relative to the insulating layers in the stack. For example, the exposed surfaces extend in the X-direction and etching the exposed surfaces of the sacrificial layers 111 reduces a width of the sacrificial layers 111 on either side of the sacrificial layers 111 in the Y-direction. In some embodiments, the sacrificial layers 111 may be etched using a wet etch process (e.g., hydrofluoric etch, buffered hydrofluoric acid, phosphoric acid, etc.). In other embodiments, the exposed surfaces of the sacrificial layers 111 may be partially etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated.

Partially etching the sacrificial layers in the Y-direction reduces a width of the sacrificial layers 111 relative to the insulating layers 112 disposed in the stack 108 such that cavities are formed whose boundaries are formed by top and bottom surfaces of adjacent insulating layers 112 and a surface of the partially etched sacrificial layers 111 that face the first trenches and extend in the X-direction.

In some embodiments, an adhesive layer is formed, at operation 810, on exposed portions of sidewalls of the first cavities, the sidewalls of the insulating layer that form a sidewall of the first trenches, and on a top surface of the substrate that forms a base of the first trenches. At operation 812, a gate layer structure is formed on exposed surfaces of the adhesive layer. At operation 814, the first trenches are filled with an insulating material. In various embodiments, the adhesive layers may include a material that has good adhesion with each of the insulating layers 112, the sacrificial layers 111, and the gate layer structure, for example, Ti, Cr, TiN, WN, etc. The adhesive layers may be deposited using any suitable method including, for example, molecular beam deposition (MBD), atomic layer deposition (ALD), CVD, PECVD, MOCVD, epitaxial growth, and the like. In some embodiments, the adhesive layer may have a thickness in a range of 0.1 nm to 5 nm, inclusive, or any other suitable thickness. In some embodiments, the adhesive layer may be omitted.

In various embodiments, the gate layer structure is formed by depositing a gate dielectric and/or gate metal in the cavities (e.g., over the adhesive layer), such that the gate layer structure is a continuous along the walls of each of the first trenches, and on the top surface of the substrate 107. In various embodiments, the gate layer structure may be formed from a high-k dielectric material. Although, each of gate layers shown in FIG. 13 formed the gate layer structure are shown as a single layer, in other embodiments, the gate layer structures can be formed as a multi-layer stack (e.g., including a gate dielectric layer and a gate metal layer), while remaining within the scope of the present disclosure. The gate layer structures be formed of different high-k dielectric materials or a similar high-k dielectric material. Example high-k dielectric materials include a metal oxide or a silicate of Hf, Al, Zr, La, Mg, Ba, Ti, Pb, and combinations thereof (e.g., Al, Ti, TIN, TaN, Co, Ag, Au, Cu, Ni, Cr, Hf, Ru, W, Pt, WN, Ru, etc.). The gate layer structure can be deposited using any suitable method, including, for example, molecular beam deposition (MBD), atomic layer deposition (ALD), CVD, PECVD, MOCVD, epitaxial growth, and the like.

In some embodiments, the gate layer structure may include a stack of multiple metal materials. For example, the gate metal may be a p-type work function layer, an n-type work function layer, multi-layers thereof, or combinations thereof. The work function layer may also be referred to as a work function metal. Example p-type work function metals that may include TiN, TaN, Ru, Mo, Al, WN, ZrSi$_2$, MoSi$_2$, TaSi$_2$, NiSi$_2$, WN, other suitable p-type work function materials, or combinations thereof. Example n-type work function metals that may include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage $V_t$ is achieved in the device that is to be formed. The work function layer(s) may be deposited by CVD, physical vapor deposition (PVD), ALD, and/or other suitable process. In some embodiments, a chemical mechanical planarization (CMP) operation may be performed after filling the first trenches to planarize the top surface of the semiconductor die 900.

The insulating material may be deposited using any suitable method, for example, molecular beam deposition (MBD), atomic layer deposition (ALD), CVD, PECVD, MOCVD, epitaxial growth, and the like. The insulating material may include SiO$_2$, SiON, SiN, SiCN, HfO$_2$, TaO$_x$, TiO$_x$, AlO$_x$, etc. In some embodiments, the insulating material may be same as the material of the insulating layers 112.

At operation 816, operations 806-814 are repeated to form a second set of gate layer structures between the first set of gate layer structures formed during operations 806-814, after completely removing the sacrificial layers 111. The remaining portions of the sacrificial layers 111 may be removed by etching exposed portions of the sacrificial layers 111 in another set of first trenches formed between the previously formed first trenches. This leaves cavities between adjacent layers of insulating layers 112, and adjacent to the gate layer structure. Next, the gate layer material is deposited in the cavities so as to form another set of gate layer structures in the new set of first trenches, as described with respect to operation 812, such that the two gate layer structures abut each other and form a single gate layer, or have the adhesive layer disposed therebetween. A CMP operation may be performed after filling the second set of first trenches with the first sacrificial material 140 to planarize the top surface of the semiconductor die 900.

Figure 13:
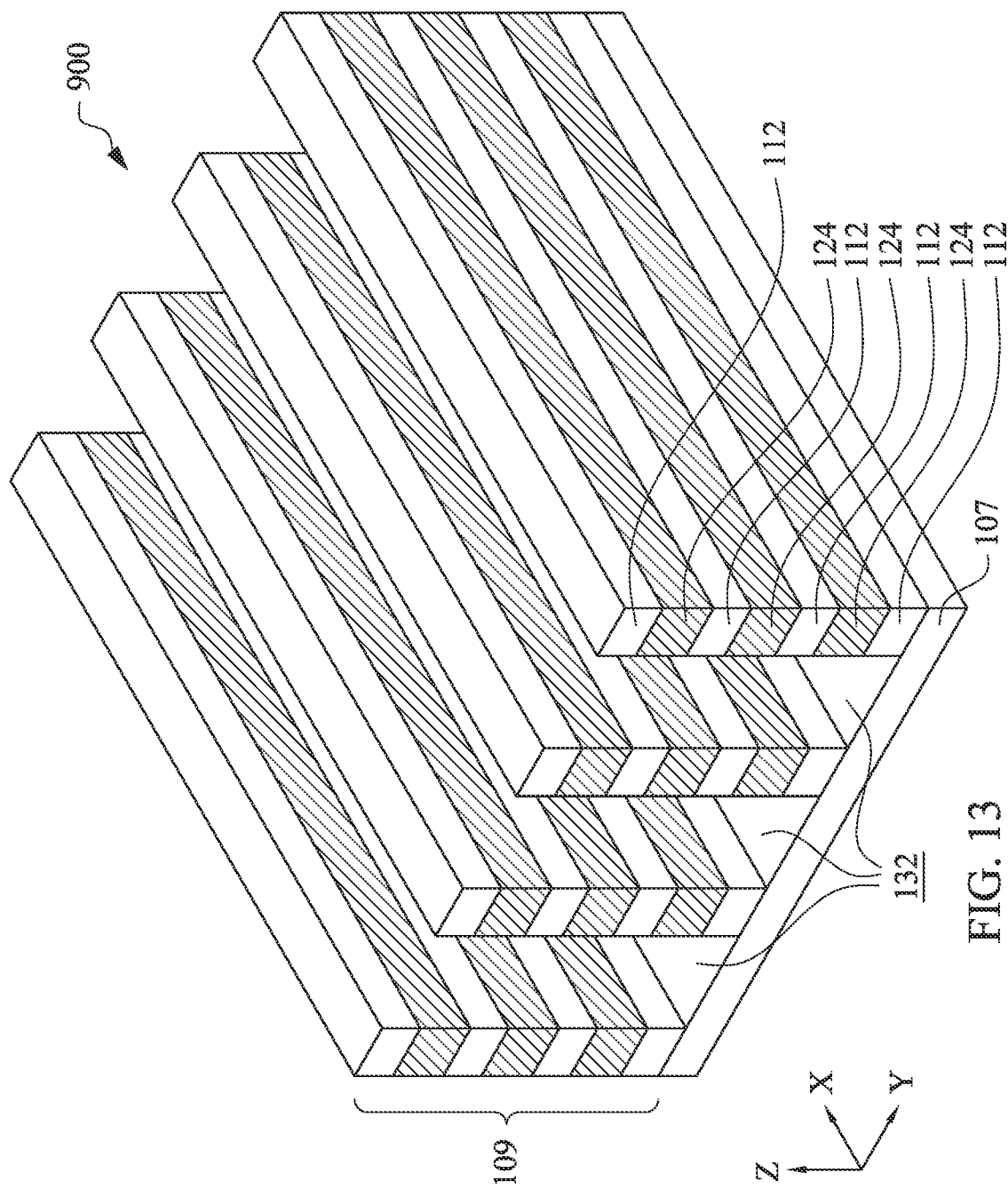

At operation 818, exposed portions of the insulating material are removed to form second trenches 132 (FIG. 13) bounded by each of the gate layer structures. At operation 820, a plurality of gate layers are formed, for example, by etching portions of the gate layer structure disposed on the top surface of the semiconductor die, portions disposed on radially inner surfaces of the insulating layers facing the trenches, portions disposed vertically between adjacent insulating layers that extend beyond a radial edge of the insulating layers, and portion disposed on top of the substrate. Corresponding to operation 806-820, FIG. 13 is a top, perspective view of the semiconductor die 900, after forming the plurality of gate layers 124 disposed between insulating layers 112.

Etching the insulating material at operation 818 also etches the topmost insulating layer 112 that is also exposed. In some embodiments, insulating material and the topmost insulating layer 112 (which may also be formed from the same material as the insulating material) may be etched using an isotropic etch (e.g., a wet etch such as an HF or BHF etch) that has high selectivity for the insulating material. In other embodiments, the insulating material and the topmost insulating layer 112 may be etched using a dry etch, for example, a plasma etching process (including radical plasma etching, remote plasma etching, and other suitable plasma etching processes, RIE, DRIE), gas sources such as Cl$_2$, HBr, CF$_4$, CHF$_3$, CH$_2$F$_2$, CH$_3$F, C$_4$F$_6$, BCl$_3$, SF$_6$, H$_2$, NF$_3$, and other suitable etch gas sources and combinations thereof can be used with passivation gases such as N$_2$, O$_2$, CO$_2$, SO$_2$, CO, CH$_4$, SiCl$_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the second trenches 132. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process.

Next, the exposed portions of the gate layer structure that remains disposed on the top surface of the semiconductor die 900 after removal of the topmost insulating layer 112, portions disposed on radially inner surfaces of the insulating layers 112 facing the trenches 132, portions disposed vertically between adjacent insulating layers 112 that extend beyond a radial edge of the insulating layers 112, and portions disposed on top of the substrate 107 are etched. This divides gate layer structure into a plurality of gate layers 124 shown in FIG. 13, such that a set of stacks 109 including a plurality of insulating layers 112 and a plurality of gate layers 124 remain disposed on the substrate 107 separated by second trenches 132 extending in the Y-direction. The second trenches 132 extend from a top surface of the semiconductor die 900 to the substrate 107 in the vertical or Z-direction. Each stack 109 includes a plurality of insulating layers 112 and gate layers 124 (and optionally, the adhesive layers) alternatively disposed on top of each other. Partially etching the gate layer structure causes the radial outer edges of the gate layers 124 to be aligned with corresponding radial outer edges of the insulating layers 112 in the Y-direction.

In some embodiments, the gate layer structure may be etched using a dry etch, for example, a plasma etching process (including radical plasma etching, remote plasma etching, and other suitable plasma etching processes, RIE, DRIE), gas sources such as Cl$_2$, HBr, CF$_4$, CHF$_3$, CH$_2$F$_2$, CH$_3$F, C$_4$F$_6$, BCl$_3$, SF$_6$, H$_2$, NF$_3$, and other suitable etch gas sources and combinations thereof can be used with passivation gases such as N$_2$, O$_2$, CO$_2$, SO$_2$, CO, CH$_4$, SiCl$_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the second trenches 132. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. The etch may have substantial selectivity towards the gate material relative to the material of the insulating layer 112.

At operation 822, a memory layer is formed in each of the plurality of second trenches on exposed radial surfaces of the insulating layers and the gate layers located in the second trenches, such that the memory layer extends in the first direction (e.g., the X-direction), and from the top surface of the semiconductor die to the substrate. At operation 824, a channel layer structure is formed within each of the plurality of second trenches on exposed radial surfaces of the memory layer such that the channel layer structure also extends in the first direction. At operation 826, a gate extension layer is formed on exposed radial surface of the memory layer such that the gate extension layer also extends in the first direction. At operation 828, the plurality of second trenches are filled with a first sacrificial material to form an isolation layer extending in the first direction.

Figure 14:
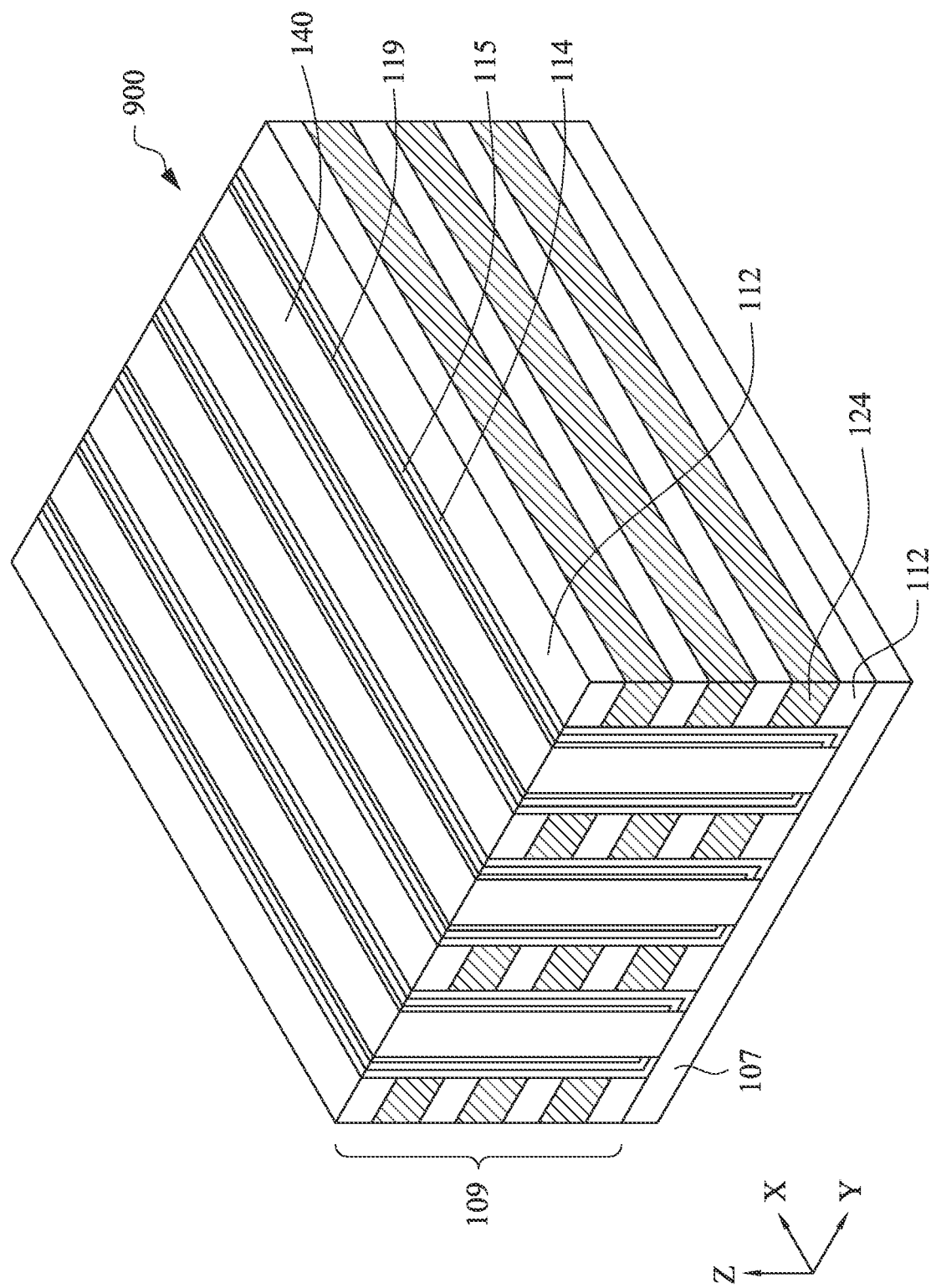

Corresponding to operations 822-28, FIG. 14 is a top, perspective view of the semiconductor die 900 after formation of the memory layer 114, a channel layer structure 115, a gate extension layer 119, and a sacrificial material 140 is disposed between adjacent gate extension layers 119. The memory layer 114 may include a ferroelectric material, for example, lead zirconate titanate (PZT), $PbZr/TiO_3$, $BaTiO_3$, $PbTiO_2$, $HfO_2$, $Hf_{1-x}Zr_xO_2$, $ZrO_2$, $TiO_2$, NiO, $TaO_x$, $Cu_2O$, $Nb_2O_5$, $AlO_x$, etc. The memory layer 114 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof. A conformal coating may be deposited such that the memory layer 114 is continuous on the walls of the second trenches 132.

The channel layer structure 115 is formed on a radially inner surface of the memory layer 114 in the Y-direction. In some embodiments, the channel layer structure 115 may be formed from a semiconductor material, for example, Si (e.g., polysilicon or amorphous silicon that may be n-type or p-type), Ge, SiGe, silicon carbide (SiC), IGZO, ITO, IZO, ZnO, IWO, etc. The channel layer structure 115 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof. A conformal coating may be deposited such that the channel layer structure 115 is continuous on the radially inner surface of the memory layer 114.

The gate extension layer 119 is formed on a radially inner surface of the channel layer structure 115 in the Y-direction. The gate extension layer 119 may be formed from a dielectric material, for example, SiN, $HfO_2$, $TaO_x$, $TiO_x$, $AlO_x$, etc. The gate extension layer 119 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof. A conformal coating may be deposited such that the gate extension layer 119 is continuous on the radially inner surface of the channel layer structure 115.

Each of the second trenches 132 are then filled with the first sacrificial material 140. In some embodiments, the first sacrificial material may include an insulator material (e.g., SiO, SiN, SiON, SiCN, SiC, SiOC, SiOCN, the like, or combinations thereof. In some embodiments, the first sacrificial material 140 may be formed from the same material as the plurality of insulating layers 112 (e.g., $SiO_2$, SiN, SION, SiCN, $HfO_2$, $TaO_x$, $TiO_x$, $AlO_x$, etc.). The first sacrificial material 140 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof, a high aspect ratio process (HARP), another applicable process, or combinations thereof. Thus, a plurality of rows that include the memory layer 114, the channel layer structure 115, the gate extension layer 119, and the first sacrificial material 140 are formed in the semiconductor die 900, and extend in the X-direction. A CMP operation may be performed after forming the first sacrificial material 140 to planarize the top surface of the semiconductor die 900.

Figure 15:
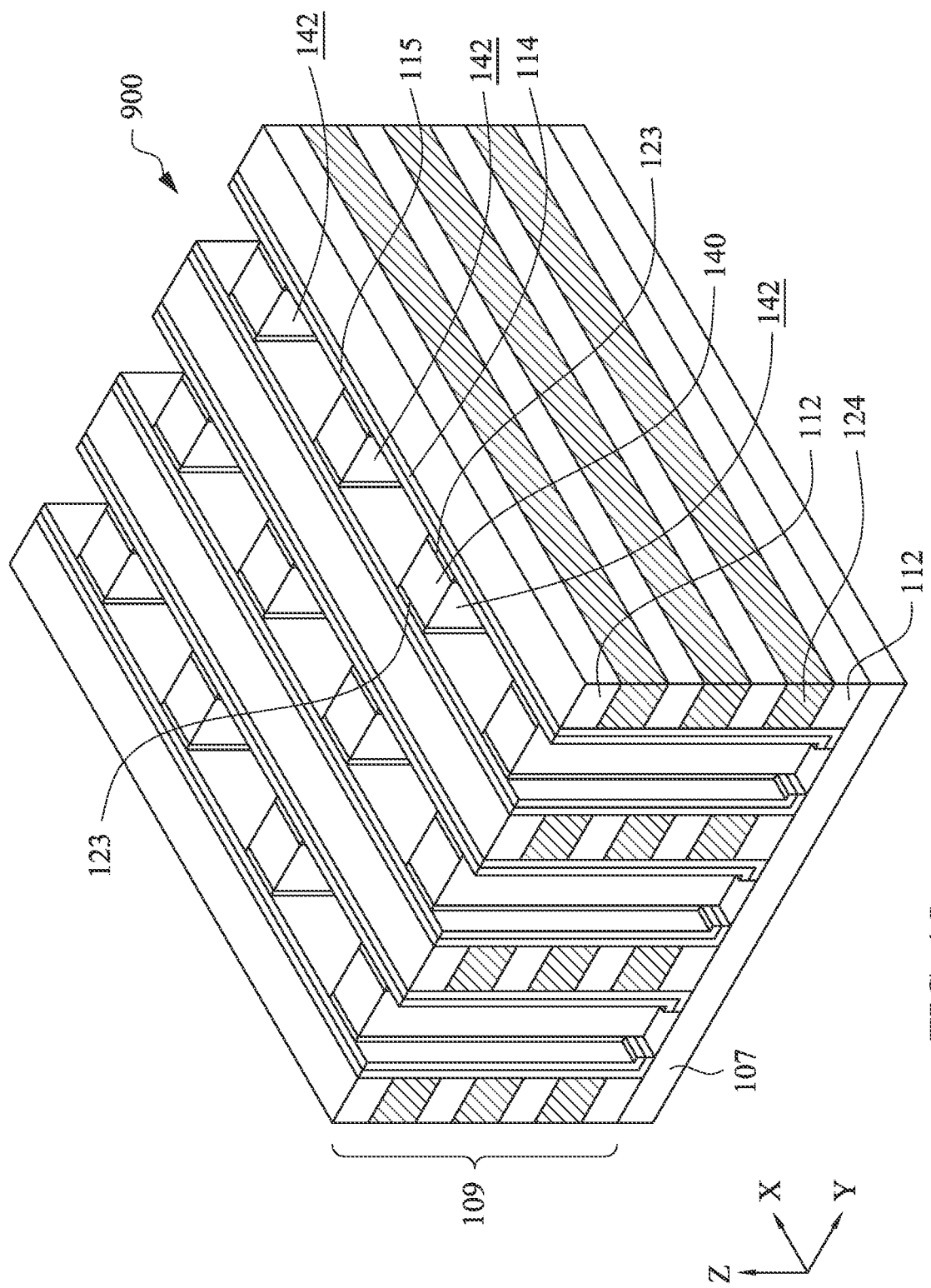

At operation 830, portions of the first sacrificial material and the gate extension layer are etched to form first cavities and gate extension structures. Corresponding to operation 830, FIG. 15 is a top, perspective view of the semiconductor die 900 after forming the first cavities 142. A plurality of first cavities 142 are formed by etching through the first sacrificial material 140 and the gate extension layer 119 from a top surface of the semiconductor die 900 to a top surface of the substrate 107 in the Z-direction, which also results in formation of the gate extension structures 123. The plurality of first cavities 142 may be formed using the same process used to form the plurality of first trenches. For example, the first cavities 142 may be formed, for example, by depositing a photoresist or other masking layer on a top surface of the semiconductor die 900, and a pattern corresponding to the first cavities 142 defined in the masking layer (e.g., via photolithography, e-beam lithography, or any other suitable lithographic process). In other embodiments, a hard mask may be used. Subsequently, the first sacrificial material 140 may be etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the first cavities 142. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated.

Figure 16:
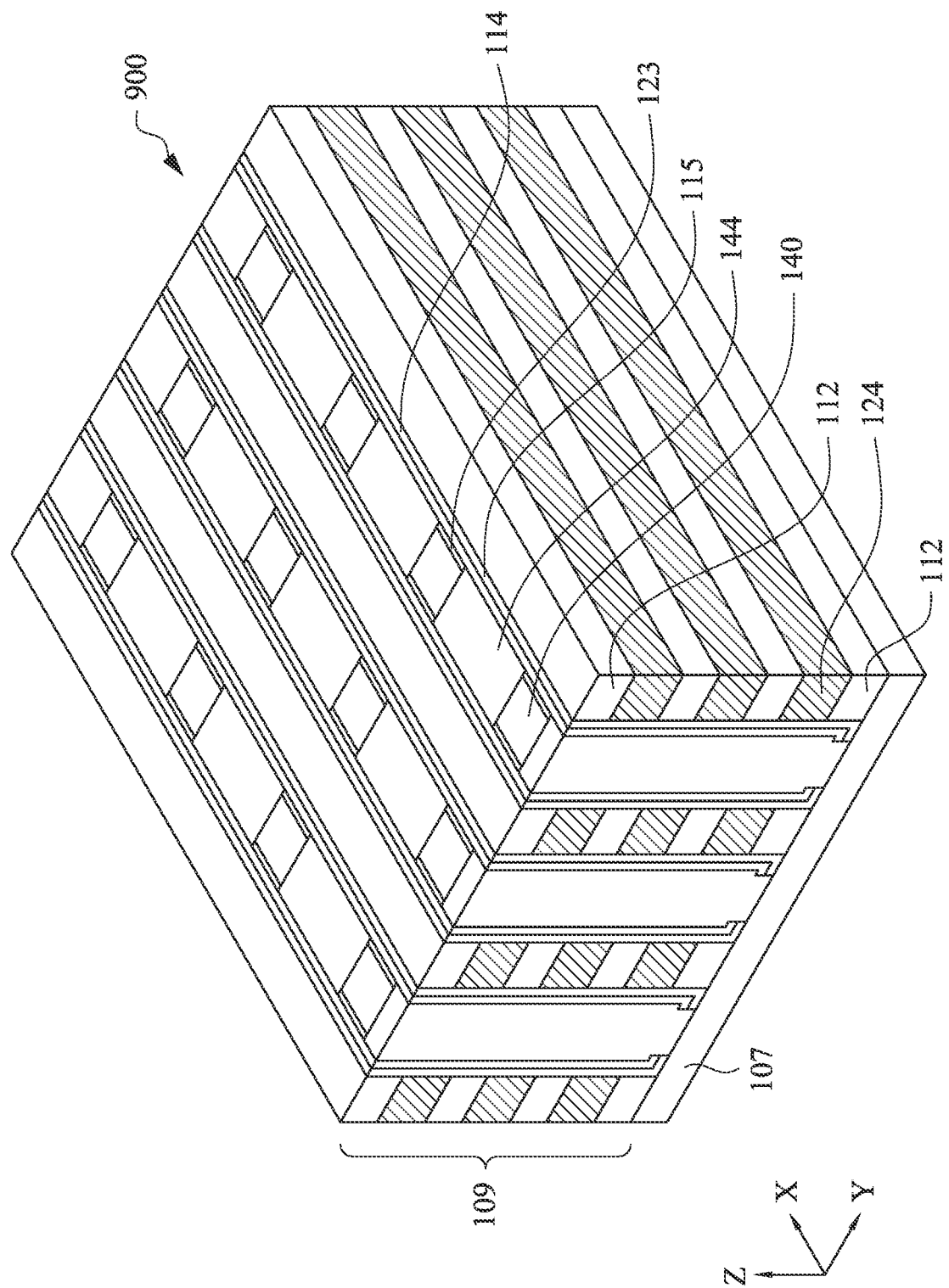

At operation 832, a second sacrificial material is deposited in the first cavities. Corresponding to operation 832, FIG. 16 is a top, perspective view of the semiconductor die 900 after depositing a second sacrificial material 144 in the first cavities 142. The second sacrificial material 144 may be deposited using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof, a high aspect ratio process (HARP), another applicable process, or combinations thereof. The second sacrificial material 144 may be the same or different from the first sacrificial material 140. For example, the second sacrificial material 144 may include SiN, $HfO_2$, $TaO_x$, $TiO_x$, $AlO_x$, any other material, or any suitable combinations thereof. In some embodiments, the second sacrificial material 144 may include the same material from which the sacrificial layers 111 were formed. In other embodiments, the second sacrificial material 144 may include the same material from which the insulating layers 112 were formed. In various embodiments, the second sacrificial material 144 has a high etch selectivity relative to the material of the insulating layers 112. The second sacrificial material 144 is bounded in the first direction (e.g., the X-direction) by the first sacrificial material 140, and in the second direction (e.g., the Y-direction) by the channel layer structure 115. A CMP process may be performed after depositing the second sacrificial material 144 by planarizing a top surface of the semiconductor die 900.

Figure 17:
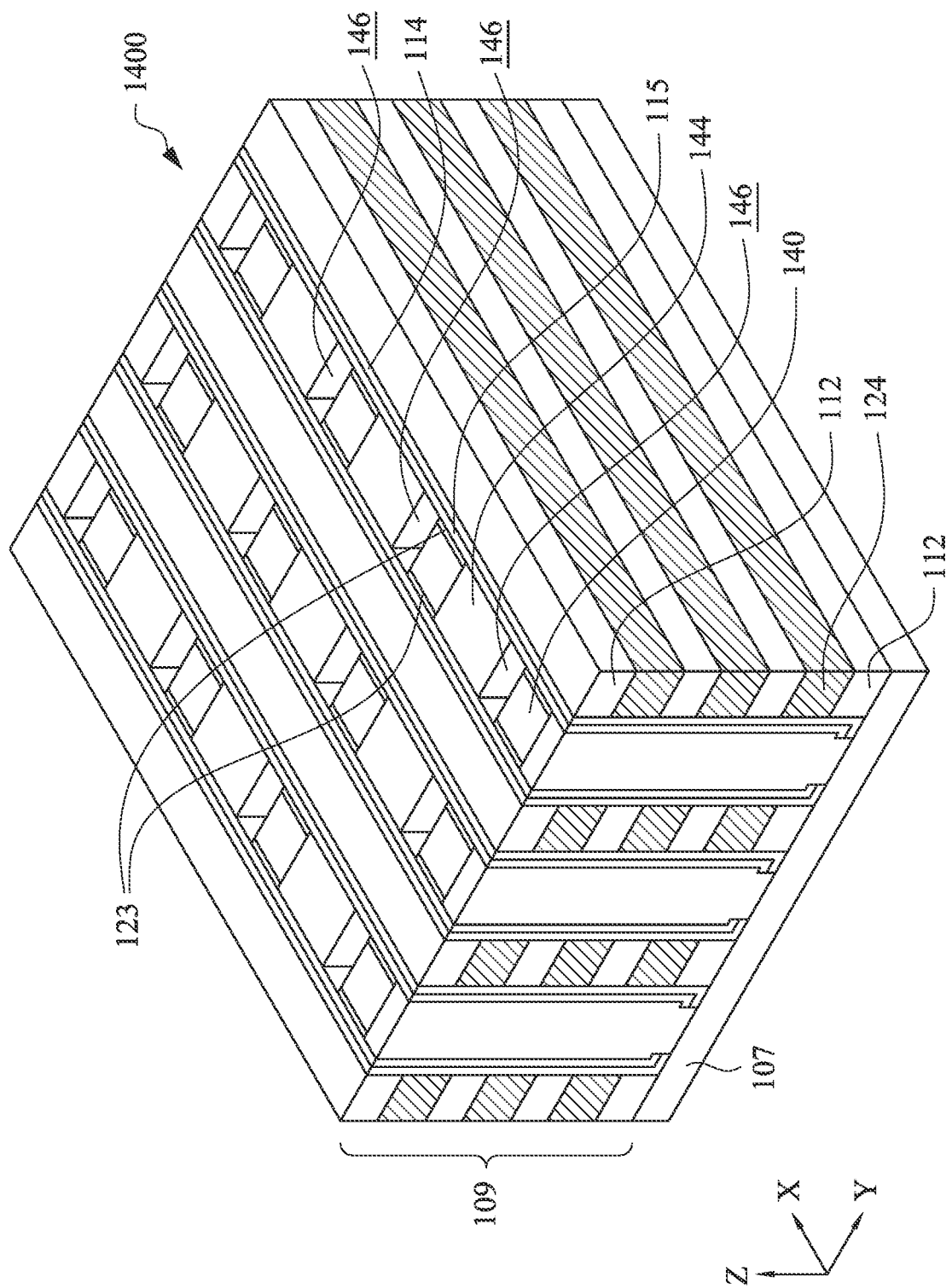

At operation 834, portions of the second sacrificial material are etched to form second cavities. Corresponding to operation 834, FIG. 17 is top, perspective view of the semiconductor die 900 after etching portions of the second sacrificial material 144 as well as from a top surface of the semiconductor die 900 to a top surface of the substrate 107 to form second cavities 146 through the second sacrificial material 144. The second cavities 146 may be formed using the same process used to form the plurality of first cavities 142. For example, the second cavities 146 may be formed, for example, by depositing a photoresist or other masking layer on a top surface of the semiconductor die 900, and a pattern corresponding to the second cavities 146 defined in the masking layer (e.g., via photolithography, e-beam lithography, or any other suitable lithographic process). In other embodiments, a hard mask may be used. Subsequently, the second sacrificial material 144 may be etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the second cavities 146. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated.

Figure 18:
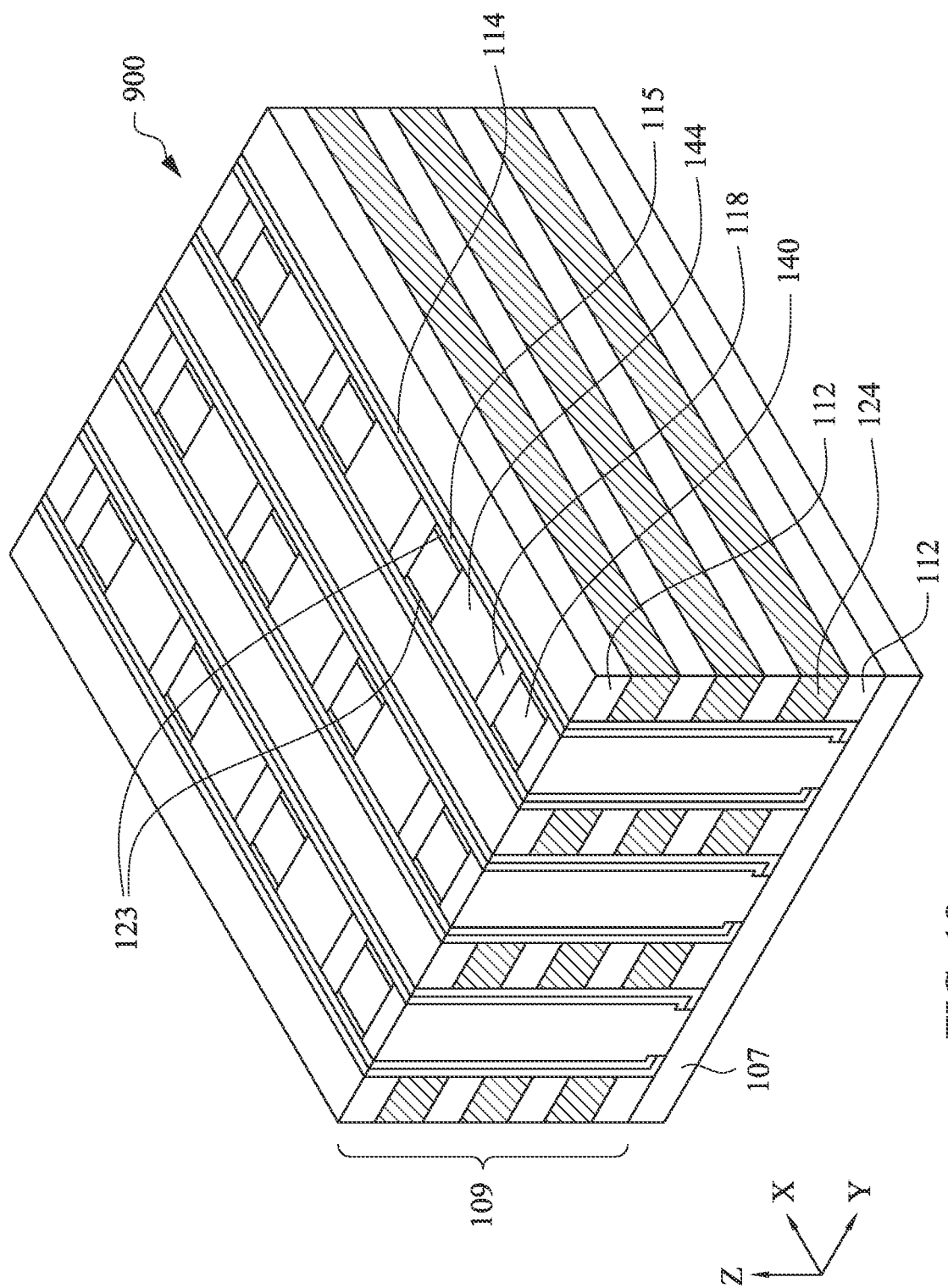

At operation 836, inner spacers of the semiconductor devices are formed. Corresponding to operation 836, FIG. 18 is top, perspective view of the semiconductor die 900 after filling the second cavities 146 with an insulating material to form the inner spacers 118. The inner spacer 118 is bounded by the channel layer structure 115 in the Y-direction, and by the first sacrificial material 140 and the gate extension structure 123 at a first surface in the X-direction and the second sacrificial material 144 at a second surface opposite the first surface in the X-direction. In some embodiments, the insulating material used to form the inner spacers 118 may include, for example, silicon nitride (SiN), silicon oxide (SiO), $SiO_2$, silicon carbide nitride (SiCN), silicon oxycarbonitride (SiOCN), silicon oxynitride (SiON), HfO2, $TaO_x$, $TiO_x$, $AlO_x$, etc. In some embodiments, the inner spacer 118 may be formed from the same material as the plurality of insulating layers 112. The insulating material may be deposited using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof, a high aspect ratio process (HARP), another applicable process, or combinations thereof. A CMP operation may be performed after depositing the second sacrificial material to planarize the top surface of the semiconductor die 900.

Figure 19:
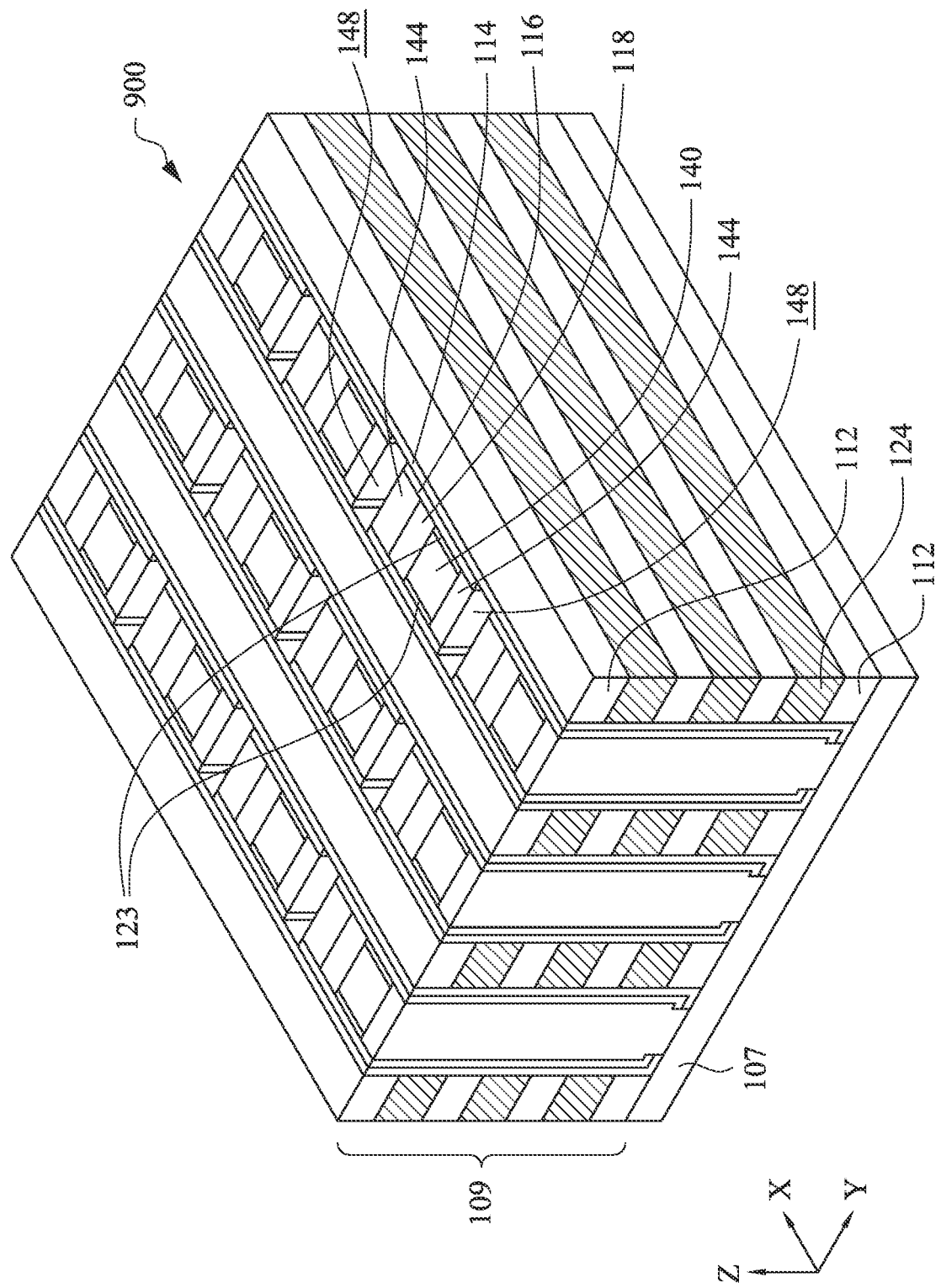

At operation 838, portions of the second sacrificial material and the channel layer structure are etched to form third cavities through the second sacrificial material, and form the channel layers of each of the semiconductor devices. Corresponding to operation 838, FIG. 19 is a top, perspective view of the semiconductor die 900 after etching portions of the second sacrificial material 144 as well as the channel layer structure 115 from a top surface of the semiconductor die 900 to a top surface of the substrate 107 to form third cavities 148 through the second sacrificial material 144. Portions of the channel layer structures 115 are also etched to form channel layers 116 included in each of the semiconductor devices 110 that are eventually formed in the semiconductor die 900. The third cavities 148 may be formed using the same process used to form the plurality of first cavities 142. For example, the third cavities 148 may be formed, for example, by depositing a photoresist or other masking layer on a top surface of the semiconductor die 900, and a pattern corresponding to the third cavities 148 defined in the masking layer (e.g., via photolithography, e-beam lithography, or any other suitable lithographic process). In other embodiments, a hard mask may be used.

Subsequently, the portions of the second sacrificial material 144 as well as portions of the channel layer structure 115 may be etched using a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the third cavities 148. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated.

Figure 20:
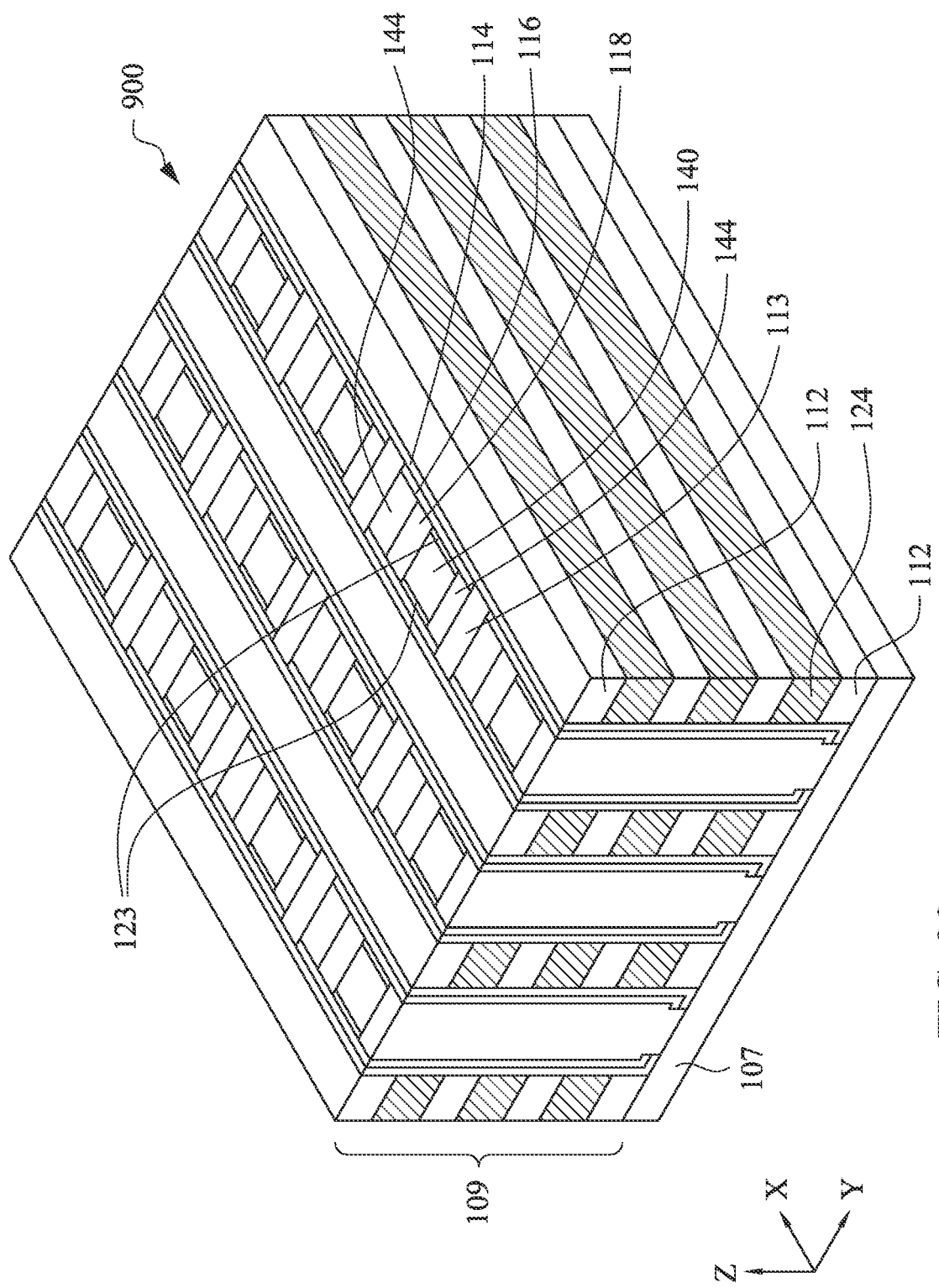

At 840, device spacers are formed. Corresponding to operation 840, FIG. 20 is a top, perspective view of the semiconductor die 900 after forming the device spacers 113. The device spacers 113 are formed by filling the plurality of third cavities 148 with an insulation material (e.g., $SiO_2$, SiN, SiON, SiCN, $HfO_2$, $TaO_x$, $TiO_x$, $AlO_x$, etc.). In some embodiments, device spacers 113 may be formed using the same material as the insulating layers 112 and/or the inner spacers 118. The device spacers 113 may be formed using physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof, a high aspect ratio process (HARP), another applicable process, or combinations thereof. Thus, a plurality of rows that include the memory layer 114, the channel layer 116, the gate extension structures 123, and the second sacrificial material 144 are formed in the semiconductor die 900 extending in the X-direction, and having device spacers 113 disposed at regular intervals separating adjacent semiconductor devices 110 that will be form in subsequent steps in the semiconductor die 900. A CMP operation may be performed after forming the device spacers 113 to planarize the top surface of the semiconductor die 900.

Figure 21:
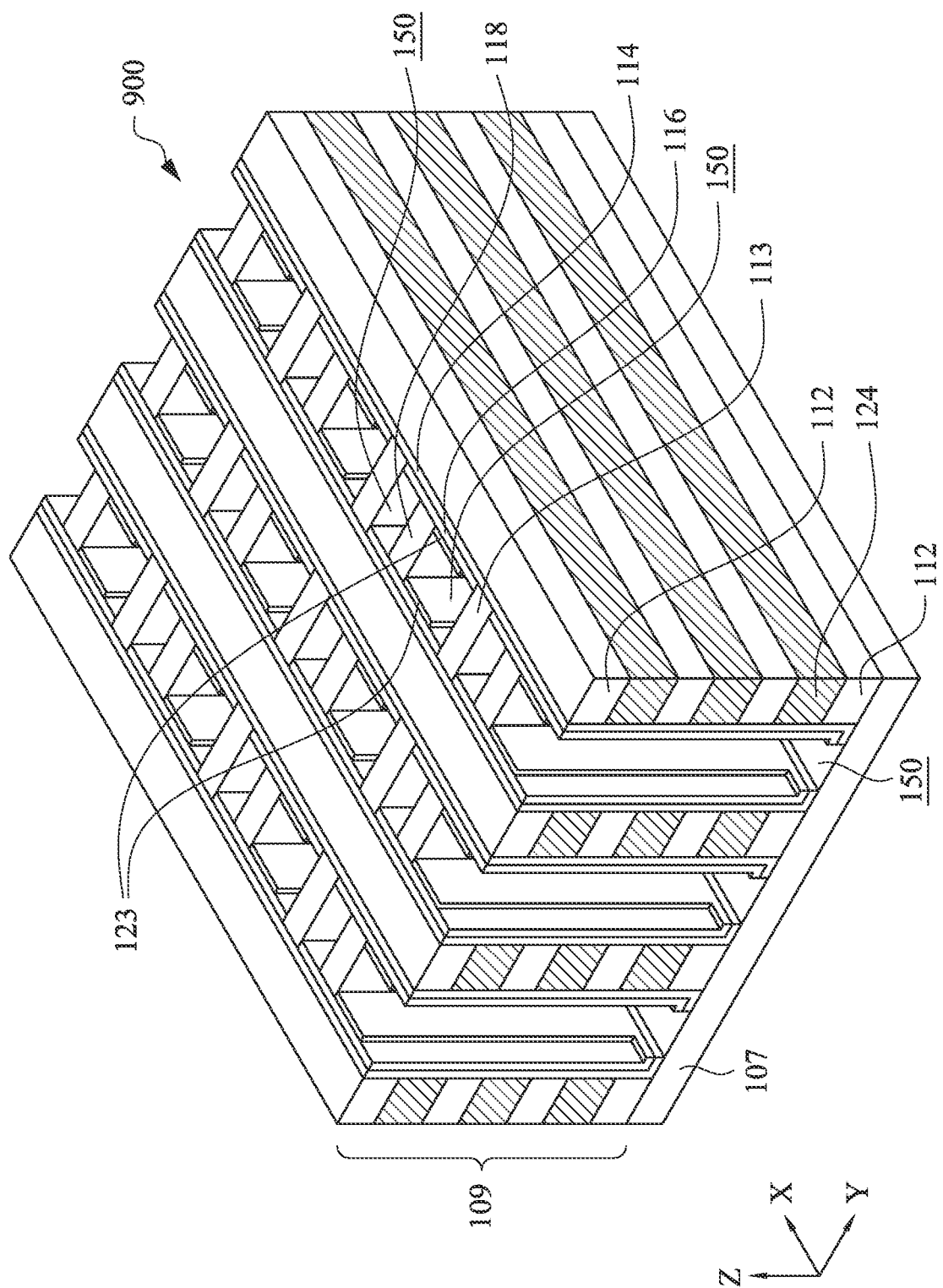

At operation 842, the first sacrificial material and the second sacrificial material are removed to form fourth cavities. Corresponding to operation 842, FIG. 21 is a top, perspective view of the semiconductor die 900 after removing the first sacrificial material 140 and the second sacrificial material 144 to form fourth cavities 150. The first and second sacrificial materials 140, 144 may be removed by etching via an isotropic etch wet etch (e.g., a hydrofluoric etch, a buffered hydrofluoric etch, a phosphoric acid etch, etc.). In other embodiments, the first and second sacrificial materials 140 and 144 are removed by etching via a dry etch process, for example, a plasma etching process (including radical plasma etching, remote plasma etching, and other suitable plasma etching processes, RIE, DRIE), gas sources such as $Cl_2$, HBr, $CF_4$, $CHF_3$, $CH_2F_2$, $CH_3F$, $C_4F_6$, $BCl_3$, $SF_6$, $H_2$, $NF_3$, and other suitable etch gas sources and combinations thereof can be used with passivation gases such as $N_2$, $O_2$, $CO_2$, $SO_2$, CO, $CH_4$, $SiCl_4$, and other suitable passivation gases and combinations thereof. Moreover, for the plasma etching process, the gas sources and/or the passivation gases can be diluted with gases such as Ar, He, Ne, and other suitable dilutive gases and combinations thereof to form the fourth cavities 150. As a non-limiting example, a source power of 10 Watts to 3,000 Watts, a bias power of 0 watts to 3,000 watts, a pressure of 1 millitorr to 5 torr, and an etch gas flow of 0 sccm to 5,000 sccm may be used in the etching process. However, it is noted that source powers, bias powers, pressures, and flow rates outside of these ranges are also contemplated.

Figure 22:
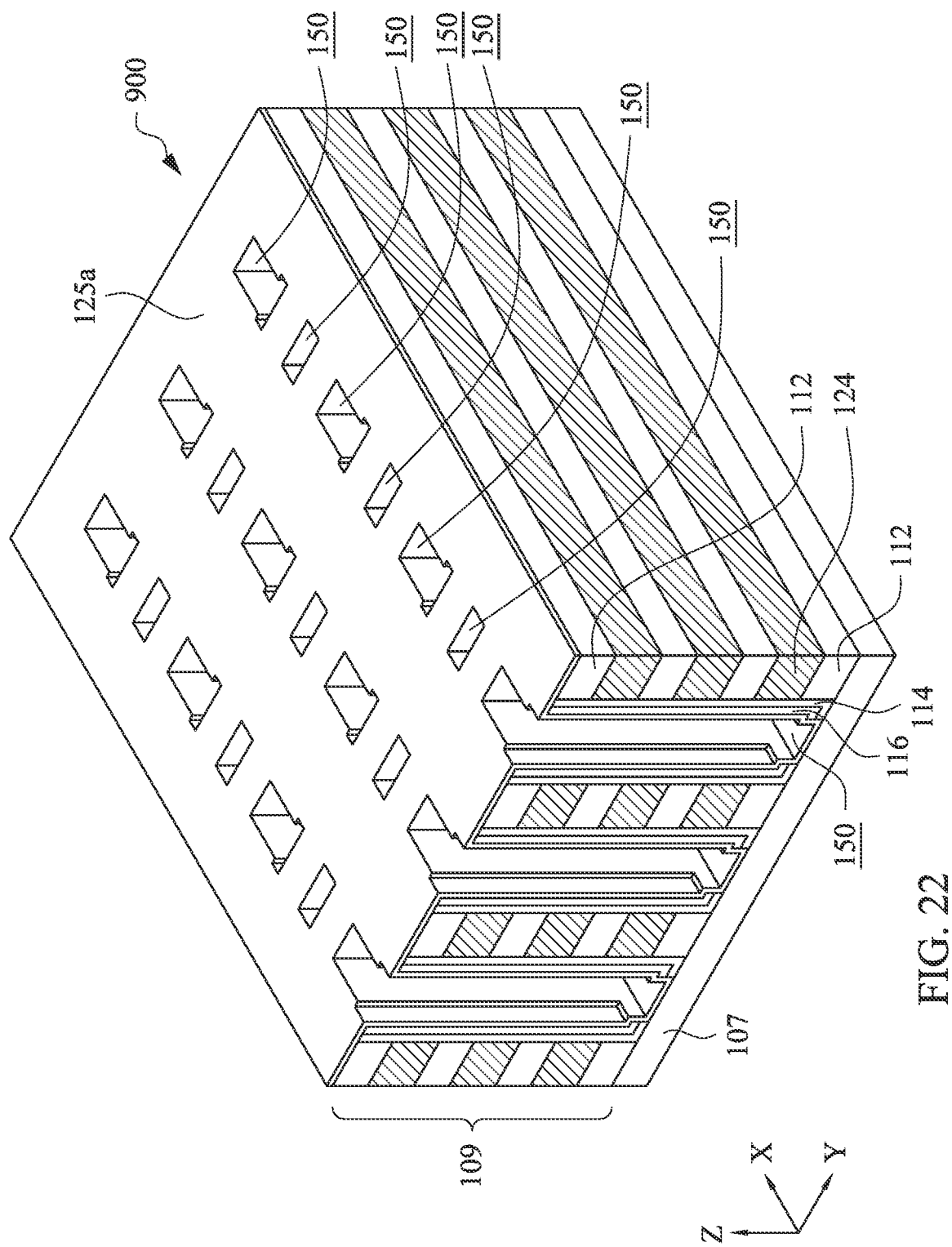

At operation 844, contact structures are formed. Corresponding to operation 844, FIG. 22 is a top, perspective view of the semiconductor die 900 after forming a contact structure layer that results in the formation of first and second contact structures 121, 126. The contact structures 121, 126 may be formed by depositing a contact structure layer 125a in the fourth cavities 150 such that the structure layer 125a is disposed on the walls of the fourth cavities 150 as well as on a top surface of the semiconductor die 900. In some embodiments, the contact structure material may include a metal, for example, Al, Ti, TiN, TaN, Co, Ag, Au, Cu, Ni, Cr, Hf, Ru, W, Pt, WN, Ru, any other suitable material or any suitable combination thereof. In some embodiments, the contact structure layer 125a may include a semiconductor material, for example, IGZO, ITO, IZO, ZnO, IWO, polysilicon or amorphous silicon (n-type or p-type), Ge, SiGe, any other suitable semiconductor material or any other suitable combination thereof. In embodiments in which the channel layer 116 also includes a semiconductor material, the contact structure layer 125a may be doped with a second concentration of a dopant (e.g., an n-type or p-type dopant) which is higher than the first concentration of the dopant, which may be same or different than the dopant doping the channel layer 116. In some embodiments, a second ratio between the second concentration of the dopant to the first concentration of the dopant is 2:1 to 100:1, inclusive (e.g., 2:1, 4:1:6:1, 8:1, 10:1, 15:1, 20:1, 25:1, 30:1, 35:1, 40:1, 45:1, 50:1, 60:1, 70:1, 80:1, 90:1, or 100:1, inclusive). However, other ranges and values are contemplated and are within the scope of this disclosure. In various embodiments, the semiconductor material of the channel layer 116, and the contact structure layer 125a may be the same or different.

The contact layer structure 125a may be formed using an epitaxial growth process, physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof, a high aspect ratio process (HARP), another applicable process, or combinations thereof. In-situ doping (ISD) may be applied to form doped contact layer structure, thereby reducing the resistance of the contact layer structure 125a below the channel layer 116. A CMP operation is performed after forming the contact structure layer 125a to planarize the top surface of the semiconductor die 900, and remove the portion of the contact structure layer 125a disposed on the top surface of the semiconductor die 900 thereby leaving portions of the contact layer structure 125a disposed in the fourth cavities 150, which results in formation of the first and second contact structures 121, 126.

Figure 23:
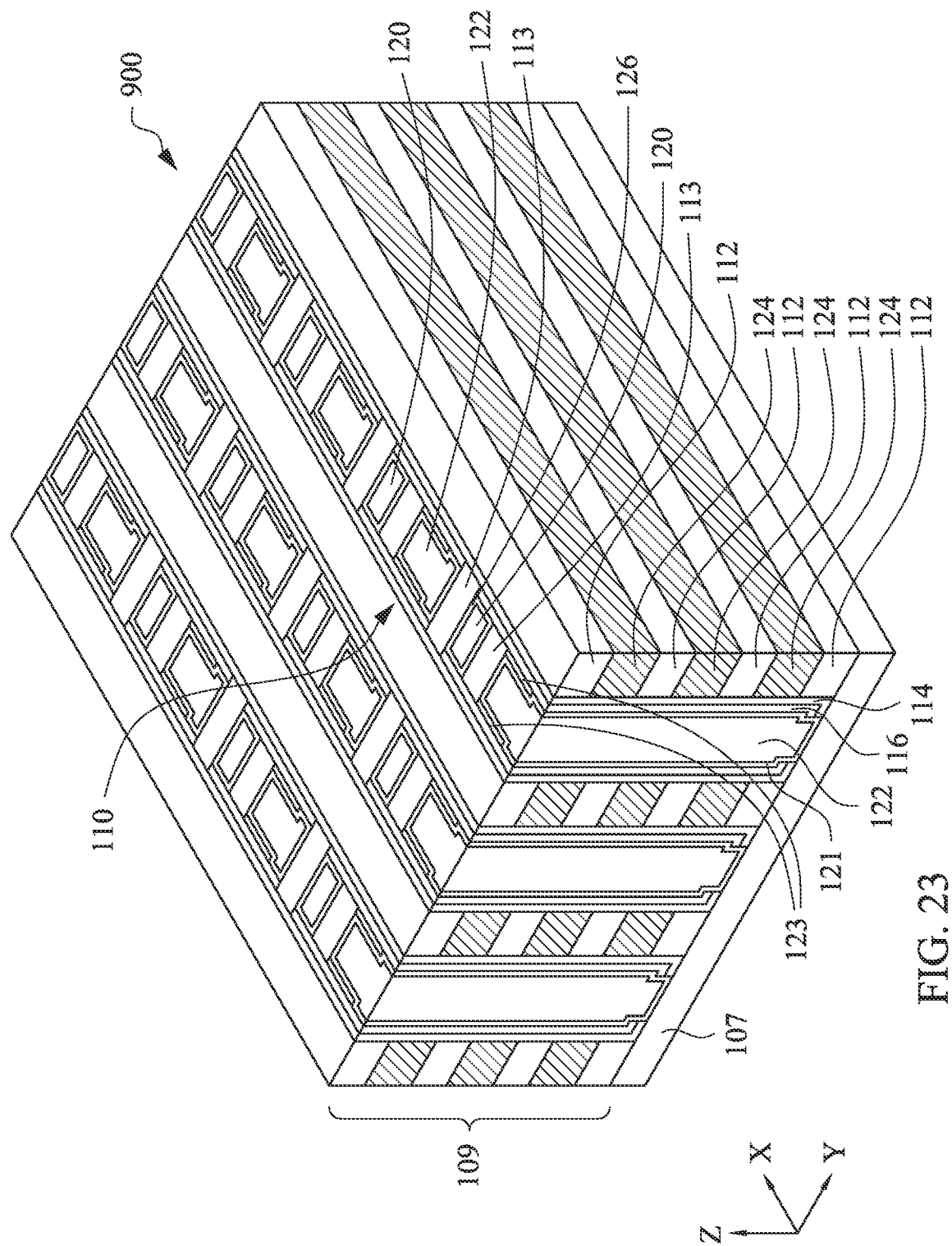

At operation 846, the source and the drain are formed. Corresponding to operation 846, FIG. 23 is a top, perspective view of the semiconductor die 900 after forming the source 120 and the drain 122. The source 120 and the drain 122 may be formed by depositing the source material in the fourth cavities 150 using an epitaxial growth process, physical vapor deposition (PVD), chemical vapor deposition (CVD), low pressure chemical vapor deposition (LPCVD), plasma enhanced CVD (PECVD), atomic layer deposition (ALD), MBE, any other suitable process or a combination thereof, a high aspect ratio process (HARP), another applicable process, or combinations thereof. In-situ doping (ISD) may be applied to form doped source 120 and doped drain 122. In various embodiments, n-type and p-type FETs are formed by implanting different types of dopants to selected regions (e.g., the source 120 or the drain 122) to form the junction(s). N-type devices can be formed by implanting arsenic (As) or phosphorous (P), and p-type devices can be formed by implanting boron (B). A first portion of the first contact structure 121 is interposed between the portions of the drain 122 and corresponding channel layer 116 at a first location, and a second portion of the first contact structure 121 is interposed between the drain 122 and the corresponding gate extension structures 123 at a second location. Moreover, a portion of the second contact structure 126 is interposed between the channel layer 116 and the source 120. Thus, an ohmic contact is formed between the source 120 and the channel layer 116, as well as the drain 122 and the channel layer 116 via the first and second contact structures 121, 126, respectively, as previously described herein.

In some embodiments, a semiconductor device comprises a source, and a drain spaced apart from the source in a first direction. A channel layer disposed radially outwards of at least one radially outer surface of the source and the drain in a second direction perpendicular to the first direction, the channel layer extending in the first direction. A memory layer disposed on a radially outer surface of the channel layer in the second direction and extending in the first direction. A contact structure is interposed between the channel layer and at least a portion of the source and/or the drain, the contact structure having a lower resistance than the channel layer.

In some embodiments, a semiconductor die comprises an array of semiconductor devices, each row of the array of semiconductor devices extending in a first direction. Each semiconductor device comprises a source, and a drain spaced apart from the source in a first direction. A channel layer is disposed radially outwards of at least one radially outer surface of the source and the drain in a second direction perpendicular to the first direction, the channel layer extending in the first direction. A memory layer is disposed on a radially outer surface of the channel layer in the second direction and extending in the first direction. At least one gate layer is disposed on a radially outer surface of the memory layer in the second direction and extending in the first direction. A gate extension structure is disposed between the drain and the channel layer such that at least a portion of a gate length of each semiconductor device is defined by each of the gate extension structures. A contact structure is wrapped around the drain such that a first portion of the contact structure is interposed between the channel layer and the drain, and a second portion of the contact structure is interposed between the gate extension structure and the drain, the contact structure having a lower resistance than the channel layer.

In some embodiments, a method of making a semiconductor device comprises providing a stack comprising a plurality of insulating layers and a plurality of sacrificial layers alternatively stacked on top of each other, the stack extending in a first direction. The method further includes forming a plurality of gate layers by replacing the plurality of sacrificial layers. The method further includes forming a memory layer extending along the first direction radially inwards of and coupled to the plurality of gate layers in a second direction perpendicular to the first direction. The method further includes forming a channel layer extending along the first direction and coupled to a radially inner surface of the memory layer in the second direction. The method further includes forming a contact structure having a lower resistance than the channel layer. The method further includes forming a source and a drain spaced apart from the source in the first direction such that the contact structure is interposed between the channel layer and at least a portion of the source and/or the drain.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a plurality of sources disposed along a line extending along a first direction;
    a plurality of drains alternating with and spaced apart from corresponding ones of the plurality of sources along the line extending along the first direction;
    a plurality of channels comprising, for each pair of a drain of the plurality of drains and a corresponding one of the plurality of sources, a channel layer disposed radially outwards of at least one radially outer surface of the source and the drain in a second direction perpendicular to the first direction, the channel layer extending rectilinearly along the first direction;
    a same memory layer disposed on a radially outer surface of the channel layer in the second direction and extending rectilinearly along the plurality of sources and the plurality of drains in the first direction;
    a plurality of source contact structures, each being interposed between one of the plurality of channels and at least a portion of one of the plurality of sources;
    a plurality of drain contact structures, each being interposed between one of the plurality of channels and at least a portion of one of the plurality of drains; and
    a plurality of device spacers spacing the plurality of channels from one another, wherein:
    the contact structure has a lower resistance than the channel layer,
    the channel layer comprises a doped semiconductor material and wherein the plurality of drain contact structures and the plurality of source contact structures each comprise a metal material.

2. The semiconductor device of claim 1, wherein the contact structure comprises:
    a first contact structure wrapped around the drain; and
    a second contact structure wrapped around the source.

3. The semiconductor device of claim 2, further comprising:
    a gate extension structure disposed between a portion of the drain and a corresponding portion of the channel layer, the gate extension structure extending rectilinearly in the first direction at least part way towards to the source, the gate extension structure comprising a first surface extending along the first direction and a second surface and extending along the first direction, the first and second surfaces constituting a majority of a total surface area of the gate extension structure.

4. The semiconductor device of claim 3, wherein the drain has a drain first width in the second direction at a plurality of locations proximate to the gate extension structure, and a drain second width in the second direction at a plurality of locations distal from the gate extension structure, the drain second width being larger than the drain first width.

5. The semiconductor device of claim 3, wherein a first axial end of the gate extension structure is disposed axially outwards of an axially inward edge of the first contact structure that is proximate to the source in the first direction, and a second axial end of the gate extension structure opposite the first axial end is axially aligned with the axially inward edge of the first contact structure.

6. The semiconductor device of claim 2, wherein the first contact structure has a first contact structure width which is about equal to a second contact structure width of the second contact structure.

7. The semiconductor device of claim 2, wherein a portion of a first contact structure is interposed between a gate extension structure and the drain.

8. The semiconductor device of claim 1, wherein the semiconductor device comprises:
    a plurality of gate layers; and
    a stack disposed on a radially outer surface of the memory layer in the second direction, the stack comprising a plurality of insulating layers and the plurality of gate layers alternatively stacked on top each other.

9. A semiconductor die, comprising:
    a continuous memory layer extending in a first direction;

an array of semiconductor devices, each row of the array of semiconductor devices extending in the first direction;

wherein each semiconductor device of the array of semiconductor devices is separated along the first direction by a device spacer of a plurality of device spacers and comprises:
a source,
a drain spaced apart from the source in the first direction,
a channel layer disposed radially outwards of at least one radially outer surface of the source and the drain in a second direction perpendicular to the first direction, the channel layer extending rectilinearly along the first direction from a first device spacer of the plurality of device spacers to a second device spacer of the plurality of device spacers,
a portion of the continuous memory layer disposed on a radially outer surface of the channel layer in the second direction and extending in the first direction,
at least one gate layer disposed on a radially outer surface of the memory layer in the second direction and extending in the first direction,
a gate extension structure disposed between the drain and the channel layer such that at least a portion of a gate length of each semiconductor device is defined by each gate extension structure, and
a contact structure wrapped around the drain such that a first portion of the contact structure is interposed between the channel layer and the drain, and a second portion of the contact structure is interposed between the gate extension structure and the drain, the contact structure having a lower resistance than the channel layer, wherein the channel layer comprises a doped semiconductor material, and wherein the contact structure comprises a metal material.

10. The semiconductor die of claim 9, wherein a first axial end of the gate extension structure is disposed axially outwards of an axially inward edge of the contact structure that is proximate to the source in the first direction, and a second axial end of the gate extension structure opposite the first axial end is axially aligned with the axially inward edge of the contact structure.

11. The semiconductor die of claim 10, wherein the drain has a drain first width in the second direction at locations proximate to the gate extension structure, and a drain second width in the second direction at locations distal from the gate extension structure, the drain second width being larger than the drain first width.

12. The semiconductor die of claim 9, wherein the contact structure is a first contact structure, the contact structure further comprising:
a second contact structure wrapped around the source such that a portion of the second contact structure is interposed between the source and the channel layer.

13. The semiconductor die of claim 12, wherein the first contact structure has a first contact structure width which is about equal to a second contact structure width of the second contact structure.

14. The semiconductor die of claim 12, wherein the first contact structure has a first contact structure width which is different from a second contact structure width of the second contact structure.

15. The semiconductor die of claim 9, wherein each semiconductor device disposed in a first row of the array of semiconductor devices is parallel to and axially aligned in the first direction with another semiconductor device disposed in a second row that is parallel to the first row in the second direction.

16. The semiconductor die of claim 9, wherein each semiconductor device disposed in a first row of the array of semiconductor devices is parallel to and axially offset in the first direction with another semiconductor device disposed in a second row that is parallel to the first row in the second direction.

17. The semiconductor die of claim 9, wherein each semiconductor device disposed in a first row of the array of semiconductor devices is oriented in a first orientation, and each semiconductor device disposed in a second row that is parallel to the first row is oriented in a second orientation that is opposite of the first orientation.

18. A semiconductor die, comprising:
a memory layer extending along a row of an array of semiconductor devices in a first direction; and
the array of semiconductor devices, each row of the array of semiconductor devices extending in the first direction, each semiconductor device of the row being separated by a device spacer of a plurality of device spacers and comprises:
a source;
a drain spaced apart from the source in the first direction;
a channel layer disposed radially outwards of at least one radially outer surface of the source and the drain in a second direction perpendicular to the first direction, the channel layer:
extending rectilinearly along the first direction from a first device spacer of the plurality of device spacers to a second device spacer of the plurality of device spacers, and
being spaced from the source and the drain along the second direction;
a portion of the memory layer disposed on a radially outer surface of the channel layer in the second direction and extending in the first direction;
a contact structure interposed between the channel layer and at least a portion of the source and/or the drain, the contact structure having a lower resistance than the channel layer, wherein the channel layer comprises a doped semiconductor material, and wherein the contact structure comprises a metal material; and
at least one gate layer disposed on a radially outer surface of the memory layer in the second direction and extending in the first direction.

19. The semiconductor die of claim 18, wherein each semiconductor device further comprises a gate extension structure disposed between the drain and the channel layer such that at least a portion of a gate length of each semiconductor device is defined by each of the gate extension structures.

20. The semiconductor die of claim 19, wherein the contact structure of each semiconductor device wraps around the drain such that a first portion of the contact structure is interposed between the channel layer and the drain, and a second portion of the contact structure is interposed between the gate extension structure and the drain.

* * * * *